(12) United States Patent
Diggins

(10) Patent No.: US 11,368,045 B2
(45) Date of Patent: Jun. 21, 2022

(54) SYSTEMS AND METHODS FOR ENERGY STORAGE USING PHOSPHORESCENCE AND WAVEGUIDES

(71) Applicant: Nimbus Engineering Inc., San Francisco, CA (US)

(72) Inventor: Alex Diggins, San Francisco, CA (US)

(73) Assignee: Nimbus Engineering Inc., San Francisco, CA (US)

( * ) Notice: Subject to any disclaimer, the term of this patent is extended or adjusted under 35 U.S.C. 154(b) by 0 days.

(21) Appl. No.: 17/199,218

(22) Filed: Mar. 11, 2021

(65) Prior Publication Data
US 2021/0203181 A1 Jul. 1, 2021

Related U.S. Application Data

(63) Continuation-in-part of application No. 16/826,604, filed on Mar. 23, 2020, now Pat. No. 11,050,291.
(Continued)

(51) Int. Cl.
*H02J 7/35* (2006.01)
*H01L 31/054* (2014.01)
(Continued)

(52) U.S. Cl.
CPC ............... *H02J 7/35* (2013.01); *F21V 9/32* (2018.02); *H01L 31/055* (2013.01);
(Continued)

(58) Field of Classification Search
CPC ... H02J 7/35; H02J 7/0068; H02J 7/00; H01L 31/0547; H01L 31/055; H01L 31/054;
(Continued)

(56) References Cited

U.S. PATENT DOCUMENTS 4,392,006 A 7/1983 Apelian
5,757,111 A 5/1998 Sato
(Continued)

FOREIGN PATENT DOCUMENTS

CN 1949544 A 4/2007
JP 2015099807 A 5/2015
(Continued)

OTHER PUBLICATIONS

EP18788591.8 European Search Report dated Nov. 27, 2020.
(Continued)

*Primary Examiner* — Robert L Deberadinis
(74) *Attorney, Agent, or Firm* — Wilson Sonsini Goodrich & Rosati

(57) ABSTRACT

Provided herein are systems and methods for storing energy. A photon battery assembly may comprise a light source, phosphorescent material, a photovoltaic cell, and a waveguide. The phosphorescent material can absorb optical energy at a first wavelength from the light source and, after a time delay, emit optical energy at a second wavelength after a time delay. The photovoltaic cell may absorb the optical energy at the second wavelength and generate electrical power. In some instances, a first waveguide may be configured to direct the optical energy at the first wavelength from the light source to the phosphorescent material and/or a second waveguide may be configured to direct the optical energy at the second wavelength from the phosphorescent material to the photovoltaic cell.

20 Claims, 21 Drawing Sheets

Related U.S. Application Data which is a continuation of application No. 16/516,801, which is a continuation of application No. PCT/US2019/020592, filed on Mar. 4, 2019, now Pat. No. 10,637,278, application No. 17/199,218, which is a continuation-in-part of application No. 15/493,823, filed on Apr. 21, 2017, now abandoned.

(60) Provisional application No. 62/638,646, filed on Mar. 5, 2018.

(51) Int. Cl.

| | | |
|---|---|---|
| *H01M 10/46* | (2006.01) | |
| *H02J 7/00* | (2006.01) | |
| *H02S 40/38* | (2014.01) | |
| *H01L 31/055* | (2014.01) | |
| *F21V 9/32* | (2018.01) | |
| *F21Y 115/10* | (2016.01) | |

(52) U.S. Cl.
CPC ...... *H01L 31/0547* (2014.12); *H01M 10/465* (2013.01); *H02J 7/0068* (2013.01); *H02S 40/38* (2014.12); *F21Y 2115/10* (2016.08)

(58) Field of Classification Search
CPC ........ H02S 40/38; F21V 9/32; H01M 10/465; H01M 10/46; F21Y 2115/10
See application file for complete search history.

(56) References Cited

U.S. PATENT DOCUMENTS

| | | | |
|---|---|---|---|
| 6,211,681 | B1 | 4/2001 | Kagawa et al. |
| 6,957,650 | B2 | 10/2005 | Nyhart, Jr. et al. |
| 8,399,889 | B2 | 3/2013 | Wu et al. |
| 10,637,278 | B2 | 4/2020 | Diggins |
| 2002/0063199 | A1 | 5/2002 | Kozuka |
| 2004/0252485 | A1 | 12/2004 | Leu et al. |
| 2005/0285121 | A1 | 12/2005 | Kim et al. |
| 2006/0170332 | A1 | 8/2006 | Tamaki et al. |
| 2007/0062572 | A1 | 3/2007 | Judd et al. |
| 2008/0143292 | A1 | 6/2008 | Ward |
| 2008/0245407 | A1 | 10/2008 | Jackson |
| 2009/0014055 | A1 | 1/2009 | Beck et al. |
| 2009/0052833 | A1 | 2/2009 | Yang et al. |
| 2009/0266397 | A1 | 10/2009 | Gibson et al. |
| 2009/0272426 | A1 | 11/2009 | Winscom |
| 2010/0193011 | A1 | 8/2010 | Mapel et al. |
| 2010/0206355 | A1 | 8/2010 | Johnson |
| 2010/0263723 | A1 | 10/2010 | Allen et al. |
| 2011/0175071 | A1 | 7/2011 | Masui et al. |
| 2011/0210718 | A1 | 9/2011 | Vana et al. |
| 2011/0253197 | A1 | 10/2011 | Mapel et al. |
| 2011/0291607 | A1 | 12/2011 | Rossi et al. |
| 2012/0187763 | A1 | 7/2012 | Hodges et al. |
| 2013/0057197 | A1 | 3/2013 | Martin Ramos |
| 2013/0133736 | A1 | 5/2013 | Van et al. |
| 2014/0000704 | A1 | 1/2014 | Farahi |
| 2015/0107671 | A1 | 4/2015 | Bodan et al. |
| 2015/0155511 | A1 | 6/2015 | Ohsawa et al. |
| 2015/0214414 | A1 | 7/2015 | Hodges |
| 2016/0002238 | A1 | 1/2016 | Umeda et al. |
| 2016/0217878 | A1 | 7/2016 | Nino et al. |
| 2017/0140603 | A1 | 5/2017 | Ricci |
| 2018/0308601 | A1 | 10/2018 | Diggins |
| 2019/0363208 | A1 | 11/2019 | Diggins |
| 2021/0044136 | A1 | 2/2021 | Diggins |

FOREIGN PATENT DOCUMENTS

| | | |
|---|---|---|
| WO | WO-2009141295 A1 | 11/2009 |
| WO | WO-2012045924 A1 | 4/2012 |
| WO | WO-2013069785 A1 | 5/2013 |
| WO | WO-2013190065 A1 | 12/2013 |
| WO | WO-2018194745 A1 | 10/2018 |
| WO | WO-2019213655 | 7/2019 |
| WO | WO-2019173236 | 9/2019 |
| WO | WO-2021055831 | 3/2021 |

OTHER PUBLICATIONS

Minnaert, et al., A proposal for typical artificial light sources for the characterization of indoor photovoltaic applications. Energies 2014, 7, 1500-1516.
PCT/US2018/018682 International Search Report and Written Opinion dated May 8, 2018.
PCT/US2019/020592 International Search Report and Written Opinion dated May 17, 2019.
PCT/US2019/030897 International Search Report and Written Opinion dated Jul. 26, 2019.
PCT/US20/51606 International Search Report and Written Opinion dated Jan. 5, 2021.
U.S. Appl. No. 16/516,801 Notice of Allowance dated Apr. 3, 2020.
U.S. Appl. No. 16/516,801 Notice of Allowance dated Mar. 2, 2020.
U.S. Appl. No. 15/493,823 Office Action dated Dec. 11, 2019.
U.S. Appl. No. 15/493,823 Office Action dated Jun. 19, 2019.
U.S. Appl. No. 15/493,823 Office Action dated Nov. 23, 2018.
U.S. Appl. No. 15/493,823 Office Action dated Sep. 15, 2020.
U.S. Appl. No. 15/493,823 Office Action dated Sep. 5, 2018.
U.S. Appl. No. 16/535,297 Notice of Allowance dated Feb. 3, 2021.
U.S. Appl. No. 16/535,297 Office Action dated Jun. 25, 2020.
Co-pending U.S. Appl. No. 17/229,536, inventor Diggins; Alex, filed Apr. 13, 2021.
EP19765112.8 Extended European Search Report dated Nov. 18, 2021.
U.S. Appl. No. 16/826,604 Notice of Allowance dated May 11, 2021.

SYSTEMS AND METHODS FOR ENERGY STORAGE USING PHOSPHORESCENCE AND WAVEGUIDES

CROSS-REFERENCE

This application is a continuation-in-part of U.S. patent app. Ser. No. 16/826,604, filed Mar. 23, 2020, which is a continuation of U.S. patent app. Ser. No. 16/516,801, filed Jul. 19, 2019, which is a continuation of International Patent Application No. PCT/US19/020592, filed Mar. 4, 2019, which claims benefit of U.S. Provisional Application No. 62/638,646, filed Mar. 5, 2018, and this application is a continuation-in-part of U.S. patent app. Ser. No 15/493,823, filed Apr. 21, 2017; each of which applications is entirely incorporated herein by reference for all purposes.

BACKGROUND

Especially in an age where so many activities and functions depend on a continuous supply of power, lapses or interruptions in the provision of power may lead to highly undesirable results. These recent years have seen a fast-growing market for readily accessible power, such as in batteries, supercapacitors, fuel cells, and other energy storage devices. However, such energy storage devices are often limited in many aspects. For example, they may be volatile or unstable under certain operating conditions (e.g., temperature, pressure) and become ineffective or pose a safety hazard. In some cases, an energy storage device may itself be consumed during one or more cycles of converting or storing energy and thus have limited lifetime. In some cases, a rate of charging may be too slow to effectively support or satisfy a rate of consumption of power.

SUMMARY

Recognized herein is a need for reliable systems and methods for energy storage. The systems and methods for energy storage disclosed herein may provide superior charging rates to those of conventional chemical batteries, for example, on the order of 100 times faster or more. The systems and methods disclosed herein may provide superior lifetimes to those of conventional chemical batteries, for example, on the order of 10 times more recharge cycles or more. The systems and methods disclosed herein may be portable. The systems and methods disclosed herein may be stable and effective in relatively cold operating temperature conditions.

The systems and methods disclosed herein may use phosphorescent material to store energy over a finite duration of time. For example, the phosphorescent material may store and/or convert energy with substantial time delay. The systems and methods disclosed herein may use light sources to provide an initial source of energy in the form of optical energy. The light sources can be artificial light sources, such as light emitting diodes (LEDs). The systems and methods disclosed herein may use photovoltaic cells to generate electrical power from optical energy. In some embodiments, the systems and methods disclosed herein may use radioactive material to excite (or otherwise stimulate) the phosphorescent material. A system for energy storage may comprise a light source, a phosphorescent material, a photovoltaic cell, and a waveguide to direct waves between the light source and the phosphorescent material and/or between the photovoltaic cell and the phosphorescent material.

In an aspect, provided is a system for storing energy, comprising: a light source configured to emit optical energy at a first wavelength from a surface of the light source; a phosphorescent material configured to (i) absorb the optical energy at the first wavelength, and (ii) at a rate slower than a rate of absorption, emit optical energy at a second wavelength, wherein the second wavelength is greater than the first wavelength; a photovoltaic cell adjacent to the phosphorescent material, wherein the photovoltaic cell is configured to (i) absorb optical energy at the second wavelength, and (ii) generate electrical power from optical energy; and a waveguide adjacent to the phosphorescent material, wherein the waveguide is configured to (i) direct the optical energy at the first wavelength from the light source to the phosphorescent material or (ii) direct the optical energy at the second wavelength from the phosphorescent material to the photovoltaic cell.

In some embodiments, the waveguide is configured to direct the optical energy at the first wavelength from the light source to the phosphorescent material and wherein the system comprises a second waveguide configured to direct the optical energy at the second wavelength from the phosphorescent material to the photovoltaic cell. In some embodiments, the second waveguide and the phosphorescent material are concentric.

In some embodiments, the waveguide is configured to direct the optical energy at the first wavelength from the light source to the phosphorescent material, and wherein the waveguide is adjacent to the light source. In some embodiments, the waveguide is in contact with the light source.

In some embodiments, the waveguide is configured to direct the optical energy at the second wavelength from the phosphorescent material to the photovoltaic cell, and wherein the waveguide is adjacent to the photovoltaic cell. In some embodiments, the waveguide is in contact with the photovoltaic cell.

In some embodiments, the waveguide comprises one or more reflective surfaces, wherein the reflective surfaces are configured to (i) direct the optical energy at the first wavelength from the light source to the phosphorescent material or (ii) direct the optical energy at the second wavelength from the phosphorescent material to the photovoltaic cell. In some embodiments, the waveguide comprises a plurality of reflective surfaces having increasingly large reflective surfaces along an optical path within the waveguide, such that a first set of waves from the light source are configured to be reflected at a first reflective surface of the plurality of reflective surfaces for excitation of a first volume of phosphorescent material, and a second set of waves from the light source are configured to be reflected at a second reflective surface of the plurality of reflective surfaces for excitation of a second volume of phosphorescent material, wherein the second volume of phosphorescent material is disposed at a greater distance from the light source than the first volume of phosphorescent material.

In some embodiments, the light source is a light-emitting diode (LED).

In some embodiments, a rechargeable battery is electrically coupled to the light source and the photovoltaic cell, and wherein at least part of the electrical power generated by the photovoltaic cell charges the rechargeable battery, and wherein at least part of electrical power discharged by the rechargeable battery powers the light source.

In some embodiments, the phosphorescent material comprises strontium aluminate and europium. In some embodiments, the phosphorescent material comprises dysprosium.

In some embodiments, the phosphorescent material comprises grains having a particle size of less than about 5 micrometers.

In some embodiments, the phosphorescent material comprises grains having a particle size of less than about 20 nanometers.

In some embodiments, the light source is adjacent to and in contact with the waveguide.

In some embodiments, the light source is not in contact with the waveguide and the phosphorescent material. In some embodiments, the light source is located remote from the waveguide and the phosphorescent material, wherein the light source is in optical communication with the waveguide.

In some embodiments, the system further comprises a coating on the waveguide, wherein the coating is in optical communication with the waveguide and the phosphorescent material, wherein the coating comprises an optical filter. In some embodiments, the optical filter is a dichroic element. In some embodiments, the optical filter is configured to transmit waves having the first wavelength from the waveguide to the phosphorescent material and reflect waves having the second wavelength from the phosphorescent material back to the phosphorescent material. In some embodiments, the coating is in contact with the waveguide and the phosphorescent material.

In another aspect, provided is a method for storing energy, comprising: (a) emitting optical energy at a first wavelength from a surface of a light source; (b) directing the optical energy at the first wavelength, via a first waveguide, to a phosphorescent material; (c) at a rate slower than a rate of absorption of the optical energy at the first wavelength, emitting, by the phosphorescent material, optical energy at a second wavelength, wherein the second wavelength is greater than the first wavelength; (d) directing the optical energy at the second wavelength, via a second waveguide, to a photovoltaic cell, wherein the surface of the photovoltaic cell is adjacent to the phosphor; and (e) generating electrical power from the optical energy at the second wavelength.

In some embodiments, the second waveguide and the phosphorescent material are concentric.

In some embodiments, the first waveguide is adjacent to the light source.

In some embodiments, the second waveguide is adjacent to the photovoltaic cell.

In some embodiments, the first waveguide comprises one or more reflective surfaces, wherein the reflective surfaces are configured to direct the optical energy at the first wavelength from the light source to the phosphorescent material. In some embodiments, the first waveguide comprises a plurality of reflective surfaces having increasingly large reflective surfaces along an optical path within the first waveguide, such that a first set of waves from the light source are configured to be reflected at a first reflective surface of the plurality of reflective surfaces for excitation of a first volume of phosphorescent material, and a second set of waves from the light source are configured to be reflected at a second reflective surface of the plurality of reflective surfaces for excitation of a second volume of phosphorescent material, wherein the second volume of phosphorescent material is disposed at a greater distance from the light source than the first volume.

In some embodiments, the light source is a light-emitting diode (LED).

In some embodiments, a rechargeable battery is electrically coupled to the light source and the photovoltaic cell, and wherein at least part of the electrical power generated by the photovoltaic cell charges the rechargeable battery, and wherein at least part of electrical power discharged by the rechargeable battery powers the light source.

In some embodiments, the phosphorescent material comprises strontium aluminate and europium. In some embodiments, the phosphorescent material comprises dysprosium.

In some embodiments, the phosphorescent material comprises grains having a particle size of less than about 5 micrometers.

In some embodiments, the phosphorescent material comprises grains having a particle size of less than about 20 nanometers.

In some embodiments, the light source is in contact with the first waveguide.

In some embodiments, the light source is not in contact with the first waveguide and the phosphorescent material. In some embodiments, the light source is located remote from the first waveguide and the phosphorescent material, wherein the light source is in optical communication with the first waveguide.

In some embodiments, the first waveguide comprises a coating on the first waveguide, wherein the coating is in optical communication with the first waveguide and the phosphorescent material, wherein the coating comprises an optical filter. In some embodiments, the optical filter is a dichroic element. In some embodiments, the optical filter is configured to transmit waves having the first wavelength from the first waveguide to the phosphorescent material and reflect waves having the second wavelength from the phosphorescent material back to the phosphorescent material. In some embodiments, the coating is in contact with the waveguide and the phosphorescent material.

In another aspect, provided is a method for wireless charging, comprising: (a) providing a battery assembly comprising: a phosphorescent material configured to (i) absorb optical energy at a first wavelength, and (ii) at a rate slower than a rate of absorption, emit optical energy at a second wavelength, wherein the second wavelength is greater than the first wavelength; a photovoltaic cell adjacent to the phosphorescent material, wherein the photovoltaic cell is configured to (i) absorb optical energy at the second wavelength, and (ii) generate electrical power from optical energy; and a waveguide adjacent to the phosphorescent material, wherein the waveguide is configured to (i) direct the optical energy at the first wavelength from a light source to the phosphorescent material or (ii) direct the optical energy at the second wavelength from the phosphorescent material to the photovoltaic cell; and (b) providing optical energy at the first wavelength from the light source to the waveguide, wherein the light source is not in contact with the waveguide and the phosphorescent material, and wherein the light source is in optical communication with the waveguide. emitting optical energy at a first wavelength from a surface of a light source, thereby charging the battery assembly.

In another aspect, provided is a system for storing energy, comprising: a light source configured to emit optical energy at a first wavelength from a surface of the light source; a phosphorescent material adjacent to the surface of the light source, wherein the phosphorescent material is configured to (i) absorb the optical energy at the first wavelength, and (ii) at a rate slower than a rate of absorption, emit optical energy at a second wavelength, wherein the second wavelength is greater than the first wavelength; and a photovoltaic cell adjacent to the phosphorescent material, wherein the photovoltaic cell is configured to (i) absorb optical energy at the second wavelength through a surface of the photovoltaic cell, and (ii) generate electrical power from optical energy.

In some embodiments, the light source is a light-emitting diode (LED).

In some embodiments, the photovoltaic cell is electrically coupled to an electrical load. In some embodiments, at least part of the electrical power generated by the photovoltaic cell powers the electrical load.

In some embodiments, the photovoltaic cell is electrically coupled to the light source. In some embodiments, at least part of the electrical power generated by the photovoltaic cell powers the light source.

In some embodiments, a rechargeable battery is electrically coupled to the light source and the photovoltaic cell. In some embodiments, at least part of the electrical power generated by the photovoltaic cell charges the rechargeable battery, and wherein at least part of electrical power discharged by the rechargeable battery powers the light source.

In some embodiments, the first wavelength is an ultraviolet wavelength.

In some embodiments, the second wavelength is a visible wavelength.

In some embodiments, the phosphorescent material comprises strontium aluminate and europium.

In some embodiments, the system further comprises a radioactive material that emits high energy particles, wherein the high energy particles are capable of travelling through the phosphorescent material, wherein the phosphorescent material is configured to (i) absorb kinetic energy from the high energy particles, and (ii) at a rate slower than the rate of absorption of kinetic energy, emit optical energy at the second wavelength.

In some embodiments, the phosphorescent material is adjacent to the radioactive material. In some embodiments, the phosphorescent material comprises the radioactive material. In some embodiments, the radioactive material is strontium-90.

In some embodiments, the photovoltaic cell comprises a plurality of depressions between protrusions and wherein the surface of the photovoltaic cell is a surface of a protrusion defining a depression.

In another aspect, provided is a method for storing energy, comprising: emitting optical energy at a first wavelength from a surface of a light source; absorbing, by a phosphorescent material adjacent to the surface of the light source, the optical energy at the first wavelength; at a rate slower than a rate of absorption, emitting, by the phosphorescent material, optical energy at a second wavelength, wherein the second wavelength is greater than the first wavelength; absorbing the optical energy at the second wavelength through a surface of a photovoltaic cell, wherein the surface of the photovoltaic cell is adjacent to the phosphor; and generating electrical power from the optical energy at the second wavelength.

In some embodiments, the light source is a light-emitting diode (LED).

In some embodiments, the method can further comprise powering an electrical load electrically coupled to the photovoltaic cell using the electrical power. For example, the electrical load can be a mobile device. In another example, the electrical load can be an electric car.

In some embodiments, the method can further comprise powering the light source using at least part of the electrical power, wherein the light source is electrically coupled to the photovoltaic cell.

In some embodiments, the method can further comprise charging a rechargeable battery using at least part of the electrical power, wherein the rechargeable battery is electrically coupled to the photovoltaic cell. In some embodiments, the method can further comprise powering the light source using at least part of electrical power discharged by the rechargeable battery, wherein the rechargeable battery is electrically coupled to the light source.

In some embodiments, the first wavelength is an ultraviolet wavelength.

In some embodiments, the second wavelength is a visible wavelength.

In some embodiments, the phosphorescent material comprises strontium aluminate and europium.

In some embodiments, the photovoltaic cell comprises a plurality of depressions between protrusions and wherein the surface of the photovoltaic cell is a surface of a protrusion defining a depression.

In another aspect, provided is a method for storing energy, comprising: emitting high energy particles from a radioactive material, wherein the high energy particles travel through a phosphorescent material; absorbing, by the phosphorescent material, kinetic energy from the high energy particles; at a rate slower than a rate of absorption of the kinetic energy, emitting, by the phosphorescent material, optical energy; absorbing the optical energy through a surface of a photovoltaic cell, wherein the surface of the photovoltaic cell is adjacent to the phosphor; and generating electrical power from the optical energy.

In some embodiments, the radioactive material is adjacent to the phosphorescent material.

In some embodiments, the phosphorescent material comprises the radioactive material.

In some embodiments, the method can further comprise powering an electrical load electrically coupled to the photovoltaic cell using the electrical power.

In some embodiments, the optical energy is at a visible wavelength.

In some embodiments, the photovoltaic cell comprises a plurality of depressions between protrusions and wherein the surface of the photovoltaic cell is a surface of a protrusion defining a depression.

Another aspect of the present disclosure provides a non-transitory computer readable medium comprising machine executable code that, upon execution by one or more computer processors, implements any of the methods above or elsewhere herein.

Another aspect of the present disclosure provides a system comprising one or more computer processors and computer memory coupled thereto. The computer memory comprises machine executable code that, upon execution by the one or more computer processors, implements any of the methods above or elsewhere herein.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein) of which:

DETAILED DESCRIPTION

Figure 1:
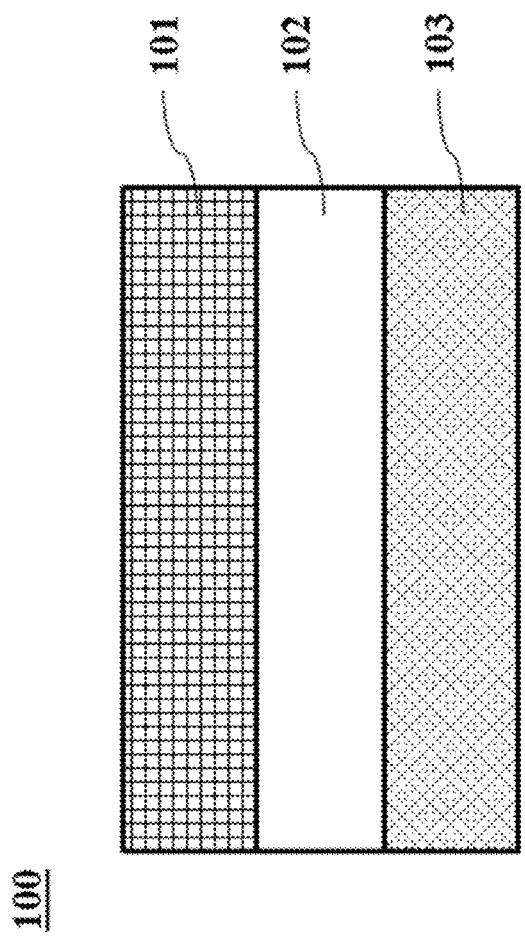
FIG. 1 shows an exemplary photon battery assembly.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Provided herein are systems and methods for energy storage. The systems and methods disclosed herein may use phosphorescent material to store energy over a significant duration of time, such as by making use of the time-delayed re-emission properties of phosphorescent material. For example, the phosphorescent material may store and/or convert energy with substantial time delay. A light source can provide an initial source of energy to the phosphorescent material in the form of optical energy. For example, the phosphorescent material may absorb optical energy from the light source at a first wavelength, and after a time delay, emit optical energy at a second wavelength. The light source can be an artificial light source, such as a light emitting diode (LED). A photovoltaic cell can generate electrical power from optical energy, such as from optical energy at the second wavelength that is emitted by the phosphorescent material.

Alternatively or in addition, the phosphorescent material may absorb kinetic energy, and after a time delay, emit optical energy converted from the kinetic energy to be absorbed by the photovoltaic cell. For example, radioactive material can excite the phosphorescent material with high energy particles (having high kinetic energy). In some cases, the phosphorescent material may itself comprise radioactive material.

A waveguide may direct waves, such as the optical energy from the light source at the first wavelength between the light source and the phosphorescent material and/or the optical energy at the second wavelength between the phosphorescent material and the photovoltaic cell. Such waveguides may increase energy density and compactness of the energy storage system. Beneficially, such waveguide may greatly increase efficiency of the time-delayed optical energy transfer between the phosphorescent material and the light source and the photovoltaic cell, as well as facilitate efficient use of the available phosphorescent material.

The systems and methods for energy storage disclosed herein may provide superior charging rates to those of conventional chemical batteries, for example, on the order of 100 times faster or more. The systems and methods disclosed herein may provide superior lifetimes to those of conventional chemical batteries, for example, on the order of 10 times more recharge cycles or more. The systems and methods disclosed herein may be portable. The systems and methods disclosed herein may be stable and effective in relatively cold operating temperature conditions.

Reference will now be made to the figures. It will be appreciated that the figures and features therein are not necessarily drawn to scale.

FIG. 1 shows an exemplary photon battery assembly. A photon battery assembly 100 can comprise a light source 101, a phosphorescent material 102, and a photovoltaic cell 103. The phosphorescent material may be adjacent to both the light source and the photovoltaic cell. For example, the phosphorescent material can be sandwiched by the light source and the photovoltaic cell. The phosphorescent material can be between the light source and the photovoltaic cell. While FIG. 1 shows the light source, phosphorescent material, and photovoltaic cell as a vertical stack, the configuration is not limited as such. For example, the light source, phosphorescent material, and photovoltaic cell can be horizontally stacked or concentrically stacked. The light source and the photovoltaic cell may or may not be adjacent to each other. In some instances, the phosphorescent material can be adjacent to a light-emitting surface of the light source. In some instances, the phosphorescent material can be adjacent to a light-absorbing surface of the photovoltaic cell.

Regardless of contact between the phosphorescent material 102 and light source 101, the phosphorescent material and the light source may be in optical communication. For example, as described elsewhere herein, the phosphorescent material and the light source may be in optical communication via a waveguide. Regardless of contact between the phosphorescent material and photovoltaic cell 103, the phosphorescent material and the photovoltaic cell may be in optical communication. For example, as described elsewhere herein, the phosphorescent material and the photovoltaic cell may be in optical communication via a waveguide. In some instances, the same waveguide may be configured to facilitate optical communication between the phosphorescent material and the photovoltaic cell and between the phosphorescent material and the light source.

The phosphorescent material 102 may or may not be contacting the light source 101. If the phosphorescent material and the light source are in contact, the phosphorescent material can interface a light-emitting surface of the light source. The phosphorescent material and the light source can be coupled or fastened together at the interface, such as via a fastening mechanism. In some instances, a support carrying the light source and/or a support carrying the phosphorescent material may be coupled or fastened together at the interface. Examples of fastening mechanisms may include, but are not limited to, form-fitting pairs, hooks and loops, latches, staples, clips, clamps, prongs, rings, brads, rubber bands, rivets, grommets, pins, ties, snaps, velcro, adhesives, tapes, a combination thereof, or any other types of fastening mechanisms. In some instances, the phosphorescent material may have adhesive and/or cohesive properties and adhere to the light source without an independent fastening mechanism. For example, the phosphorescent material may be painted or coated on the light-emitting surface of the light source. In some instances, the phosphorescent material may be coated onto primary, secondary, and/or tertiary optics of the light source. In some instances, the phosphorescent material may be coated onto other optical elements of the light source. The phosphorescent material and the light source can be permanently or detachably fastened together. For example, the phosphorescent material and the light source can be disassembled from and reassembled into the photon battery assembly 100 without damage (or with minimal damage) to the phosphorescent material and/or the light source. Alternatively, while in contact, the phosphorescent material and the light source may not be fastened together.

If the phosphorescent material 102 and the light source 101 are not in contact, the phosphorescent material can otherwise be in optical communication with a light-emitting surface of the light source, such as via a waveguide. For example, the phosphorescent material can be positioned in an optical path of light emitted by the light-emitting surface of the light source. In some instances, there can be an air gap between the phosphorescent material and the light source. In some instances, there can be another intermediary layer between the phosphorescent material and the light source. The intermediary layer can be air or other fluid. The intermediary layer can be a light guide or another layer of optical elements (e.g., lens, reflector, diffusor, beam splitter, etc.). In some instances, there can be a plurality of intermediary layers between the phosphorescent material and the light source.

The phosphorescent material 102 may or may not be contacting the photovoltaic cell 103. If the phosphorescent material and the photovoltaic cell are in contact, the phosphorescent material can interface a light-absorbing surface of the photovoltaic cell. The phosphorescent material and the photovoltaic cell can be coupled or fastened together at the interface, such as via a fastening mechanism. In some instances, a support carrying the photovoltaic cell and/or a support carrying the phosphorescent material may be coupled or fastened together at the interface. In some instances, the phosphorescent material may have adhesive properties and adhere to the photovoltaic cell without an independent fastening mechanism. For example, the phosphorescent material may be painted or coated on the light-absorbing surface of the photovoltaic cell. In some instances, the phosphorescent material may be coated onto primary, secondary, and/or tertiary optics of the photovoltaic cell. In some instances, the phosphorescent material may be coated onto other optical elements of the photovoltaic cell. The phosphorescent material and the photovoltaic cell can be permanently or detachably fastened together. For example, the phosphorescent material and the photovoltaic cell can be disassembled from and reassembled into the photon battery assembly 100 without damage (or with minimal damage) to the phosphorescent material and/or the photovoltaic cell. Alternatively, while in contact, the phosphorescent material and the photovoltaic cell may not be fastened together.

If the phosphorescent material 102 and the photovoltaic cell 103 are not in contact, the phosphorescent material can otherwise be in optical communication with a light-absorbing surface of the photovoltaic cell. For example, the light-absorbing surface of the photovoltaic cell can be positioned in an optical path of light emitted by the phosphorescent material. In some instances, there can be an air gap between the phosphorescent material and the photovoltaic cell. In some instances, there can be another intermediary layer between the phosphorescent material and the photovoltaic cell. The intermediary layer can be air or other fluid. The intermediary layer can be a light guide, light concentrator, or another layer of optical elements (e.g., lens, reflector, diffusor, beam splitter, etc.). In some instances, there can be a plurality of intermediary layers between the phosphorescent material and the photovoltaic cell.

In some instances, the photon battery assembly 100 can be assembled or disassembled, such as into the light source 101, phosphorescent material 102, or the photovoltaic cell 103 independently, or into sub-combinations thereof. In some instances, the photon battery assembly can be assembled or disassembled without damage to the different parts or with minimal damage to the different parts.

In some instances, the photon battery assembly 100 can be housed in a shell, outer casing, or other housing. The photon battery assembly 100, and/or shell thereof can be portable. For example, the photon battery assembly can have a maximum dimension of at most about 1 meter (m), 90 centimeters (cm), 80 cm, 70 cm, 60 cm, 50 cm, 45 cm, 40 cm, 35 cm, 30 cm, 25 cm, 20 cm, 15 cm, 10 cm, 9 cm, 8 cm, 7 cm, 6 cm, 5 cm, or smaller. A maximum dimension of the photon battery assembly may be a dimension of the photon battery assembly (e.g., length, width, height, depth, diameter, etc.) that is greater than the other dimensions of the photon battery assembly. Alternatively, the photon battery assembly may have greater maximum dimensions. For example, a photon battery assembly having a higher energy storage capacity can have larger dimensions and may not be portable.

The light source 101 can be an artificial light source, such as a light emitting diode (LED) or other light emitting device. For example, the light source can be a laser or a lamp. The light source can be a plurality of light emitting devices (e.g., a plurality of LEDs). In some instances, the light source can be arranged as one LED. In some instances, the light source can be arranged as rows or columns of multiple LEDs. The light source can be arranged as arrays or grids of multiple columns, rows, or other axes of LEDs. The light source can be a combination of different light emitting devices. A light emitting surface of the light source can be planar or non-planar. A light emitting surface of the light source can be substantially flat, substantially curved, or form another shape.

The light source can be supported by rigid and/or flexible supports. For example, the supports can direct the light emitted by the light source to be directional or non-directional. In some instances, the light source can comprise primary and/or secondary optical elements. In some instances, the light source can comprise tertiary optical elements. In some instances, the light source can comprise other optical elements at other levels or layers (e.g., lens, reflector, diffusor, beam splitter, etc.). The light source can be configured to convert electrical energy to optical energy. For example, the light source can be powered by an electrical power source, which may be external or internal to the photon battery assembly 100. The light source can be configured to emit optical energy (e.g., as photons), such as in the form of electromagnetic waves. In some instances, the light source can be configured to emit optical energy at a wavelength or a range of wavelengths that is capable of being absorbed by the phosphorescent material 102. For example, the light source can emit light at wavelengths in the ultraviolet range (e.g., 10 nanometers (nm) to 400 nm). In some instances, the light source can emit light at other wavelengths or ranges of wavelengths in the electromagnetic spectrum (e.g., infrared, visible, ultraviolet, x-rays, etc.).

In some instances, the light source 101 can be a natural light source (e.g., sun light), in which case the phosphorescent material 102 in the photon battery assembly 100 may be exposed to the natural light source to absorb such natural light.

The phosphorescent material 102 can absorb optical energy at a first wavelength (or first wavelength range) and emit optical energy at a second wavelength (or second wavelength range) after a substantial time delay. The second wavelength can be a different wavelength than the first wavelength. The optical energy at the first wavelength that is absorbed by the phosphorescent material can be at a higher energy level than the optical energy at the second wavelength that is emitted by the phosphorescent material. The second wavelength can be greater than the first wavelength. In an example, the phosphorescent material can absorb energy at ultraviolet range wavelengths (e.g., 10 nm to 400 nm) and emit energy at visible range wavelengths (e.g., 400 nm to 700 nm). For example, the phosphorescent material can absorb blue photons and, after a time delay, emit green photons. The phosphorescent material can absorb optical energy (e.g., photons) at other wavelengths (or ranges of wavelengths) and emit optical energy at other wavelengths (or ranges of wavelengths), such as in the electromagnetic spectrum (e.g., infrared, visible, ultraviolet, x-rays, etc.) wherein the energy emitted is at a lower energy level than the energy absorbed. A rate of emission of optical energy by the phosphorescent material can be slower than a rate of absorption of optical energy by the phosphorescent material. An advantage of this difference in rate is the ability of the phosphorescent material to release energy at a slower rate than absorbing such energy, thus storing the energy during such time delay.

The phosphorescent material 102 can be crystalline, solid, liquid, ceramic, in powder form, granular or other particle form, liquid form, or in any other shape, state, or form. The phosphorescent material can be long-lasting phosphors. In an example, the phosphorescent material can comprise strontium aluminate doped with europium (e.g., $SrAl_2O_4$: Eu). Some other examples of phosphorescent material can include, but are not limited to, zinc gallogermanates (e.g., $Zn_3Ga_2Ge_2O_{10}$:0.5% $Cr^{3+}$), zinc sulfide doped with copper and/or cobalt (e.g., ZnS:Cu, Co), strontium aluminate doped with other dopants, such as europium, dysprosium, and/or boron (e.g., $SrAl_2O_4$:$Eu^{2+}$, $Dy^{3+}$, $B^{3+}$), calcium aluminate doped with europium, dysprosium, and/or neodymium (e.g., $CaAl_2O_4$:$Eu^{2+}$, $Dy^{3+}$, $Nd^{3+}$), yttrium oxide sulfide doped with europium, magnesium, and/or titanium, (e.g., $Y_2O_2S$: $Eu^{3+}$, $Mg^{2+}$, $Ti^{4+}$), and zinc gallogermanates (e.g., $Zn_3Ga_2Ge_2O_{10}$:0.5% $Cr^{3+}$). In some instances, the phosphorescent material may be provided in granular or other particle form. Such grain or particle may have a maximum diameter of between about 1 and about 5 micrometer. In some instances, the grain or particle may have a maximum diameter of at least about 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0 micrometers or more. Alternatively or in addition, the grain or particle may have a maximum diameter of at most about 5.0, 4.9, 4.8, 4.7, 4.6, 4.5, 4.4, 4.3, 4.2, 4.1, 4.0, 3.9, 3.8, 3.7, 3.6, 3.5, 3.4, 3.3, 3.2, 3.1, 3.0, 2.9, 2.8, 2.7, 2.6, 2.5, 2.4, 2.3, 2.2, 2.1, 2.0, 1.9, 1.8, 1.7, 1.6, 1.5, 1.4, 1.3, 1.2, 1.1, 1.0 micrometers or less.

In some instances, the afterglow (e.g., emitted optical energy) emitted by the phosphorescent material can last at least about 1 hour (hr), 2 hr, 3 hr, 4 hr, 5 hr, 6 hr, 7 hr, 8 hr, 9 hr, 10 hr, 11 hr, 12 hr, 1 day, 2 days, 3 days, 4 days, 1 week, 2 weeks, 3 weeks, or longer. In some instances, the phosphorescent material can store and/or discharge energy for at least about 1 hr, 2 hr, 3 hr, 4 hr, 5 hr, 6 hr, 7 hr, 8 hr, 9 hr, 10 hr, 11 hr, 12 hr, 1 day, 2 days, 3 days, 4 days, 1 week, 2 weeks, 3 weeks, or longer. Alternatively, the afterglow emitted by the phosphorescent material (or energy stored by the phosphorescent material) can last for shorter durations.

In some instances, the phosphorescent material 102 may absorb optical energy at the first wavelength from any direction. In some instances, the phosphorescent material may emit optical energy at the second wavelength in any direction (e.g., from a surface of the phosphorescent material).

The assembly 100 can comprise one or a plurality of photovoltaic cells (e.g., photovoltaic cell 103) that are electrically connected in series and/or in parallel. The photovoltaic cell 103 can be a panel, cell, module, and/or other unit. For example, a panel can comprise one or more cells all oriented in a plane of the panel and electrically connected in various configurations. For example, a module can comprise one or more cells electrically connected in various configurations. The photovoltaic cell 103, or solar cell, can be configured to absorb optical energy and generate electrical power from the absorbed optical energy. In some instances, the photovoltaic cell can be configured to absorb optical energy at a wavelength or a range of wavelengths that is capable of being emitted by the phosphorescent material 102. The photovoltaic cell can have a single band gap that is tailored to the wavelength (or range of wavelengths) of the optical energy that is emitted by the phosphorescent material. Beneficially, this may increase the efficiency of the energy storage system of the photon battery assembly 100. For example, for strontium aluminate doped with europium as the phosphorescent material, the photovoltaic cell can have a band gap that is tailored to the green light wavelength (e.g., 500~520 nm). Similarly, the light source 101 can be tailored to emit ultraviolet range wavelengths (e.g., 20 nm to 400 nm). Alternatively, the photovoltaic cell can be configured to absorb optical energy at other wavelengths (or ranges of wavelengths) in the electromagnetic spectrum (e.g., infrared, visible, ultraviolet, x-rays, etc.).

In some embodiments, organic light emitting diodes (OLEDs) can replace the phosphorescent material 102 in the photon battery assembly 100. In some embodiments, OLEDs can replace both the light source 101 and the phosphorescent material. OLEDs can be capable of electrophosphorescence, where quasi particles in the lattice of the diodes store potential energy from an electric power source and release such energy over time in the form of optical energy at visible wavelengths (e.g., 400 nm to 700 nm). For example, OLEDs can be powered by an electrical power source, which may be external or internal to the photon battery assembly 100. A light-emitting surface of the OLEDs can interface with a light-absorbing surface of the photovoltaic cell 103 to complete the photon battery assembly. For example, with OLEDs, the photovoltaic cell can have a band gap that is tailored to the visible wavelength range (e.g., 400~700 nm).

The photovoltaic cell 103 may have any thickness. For example, the photovoltaic cell may have a thickness of about 20 micrometers. In some instances, the photovoltaic cell may have a thickness of at least about 10, 11, 12, 13, 14, 15, 16, 17, 18, 19, 20, 21, 22, 23, 24, 25, 26, 27, 28, 29, 30, 40, 50, 60, 70, 80, 90, 100 micrometers or more. Alternatively, the photovoltaic cell may have a thickness of at most about 100, 90, 80, 70, 60, 50, 40, 30, 29, 28, 27, 26, 25, 24, 23, 22, 21, 20, 19, 18, 17, 16, 15, 14, 13, 12, 11, 10 micrometers or less.

Figure 2:
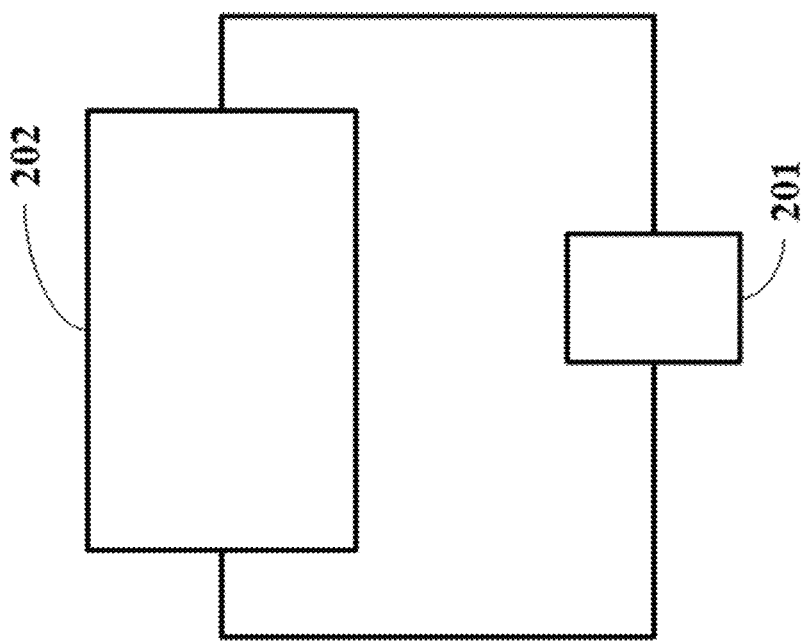
FIG. 2 shows a photon battery in communication with an electrical load.

FIG. 2 shows a photon battery in communication with an electrical load. The photon battery 201 can power an electrical load 202. The photon battery and the electrical load can be in electric communication, such as via an electric circuit. While FIG. 2 shows a circuit, the circuit configuration is not limited to the one shown in FIG. 2. The electrical load can be an electrical power consuming device. The electrical load can be an electronic device, such as a personal computer (e.g., portable PC), slate or tablet PC (e.g., Apple® iPad, Samsung® Galaxy Tab), telephone, Smart phone (e.g., Apple® iPhone, Android-enabled device, Blackberry®), or personal digital assistant. The electronic device can be mobile or non-mobile. The electrical load can be a vehicle, such as an automobile, electric car, train, boat, or airplane. The electrical load can be a power grid. In some cases, the electrical load can be another battery or other energy storage system which is charged by the photon battery. In some instances, the photon battery can be integrated in the electrical load. In some instances, the photon battery can be permanently or detachably coupled to the electrical load. For example, the photon battery can be removable from the electrical load.

In some cases, a photon battery 201 can power a plurality of electrical loads in series or in parallel. In some cases, a photon battery can power a plurality of electrical loads simultaneously. For example, the photon battery can power 2, 3, 4, 5, 6, 7, 8, 9, 10 or more electrical loads simultaneously. In some cases, a plurality of photon batteries, electrically connected in series or in parallel, can power an electrical load. In some cases, a combination of one or more photon batteries and one or more other types of energy storage systems (e.g., lithium ion battery, fuel cell, etc.) can power one or more electrical loads.

Figure 3:
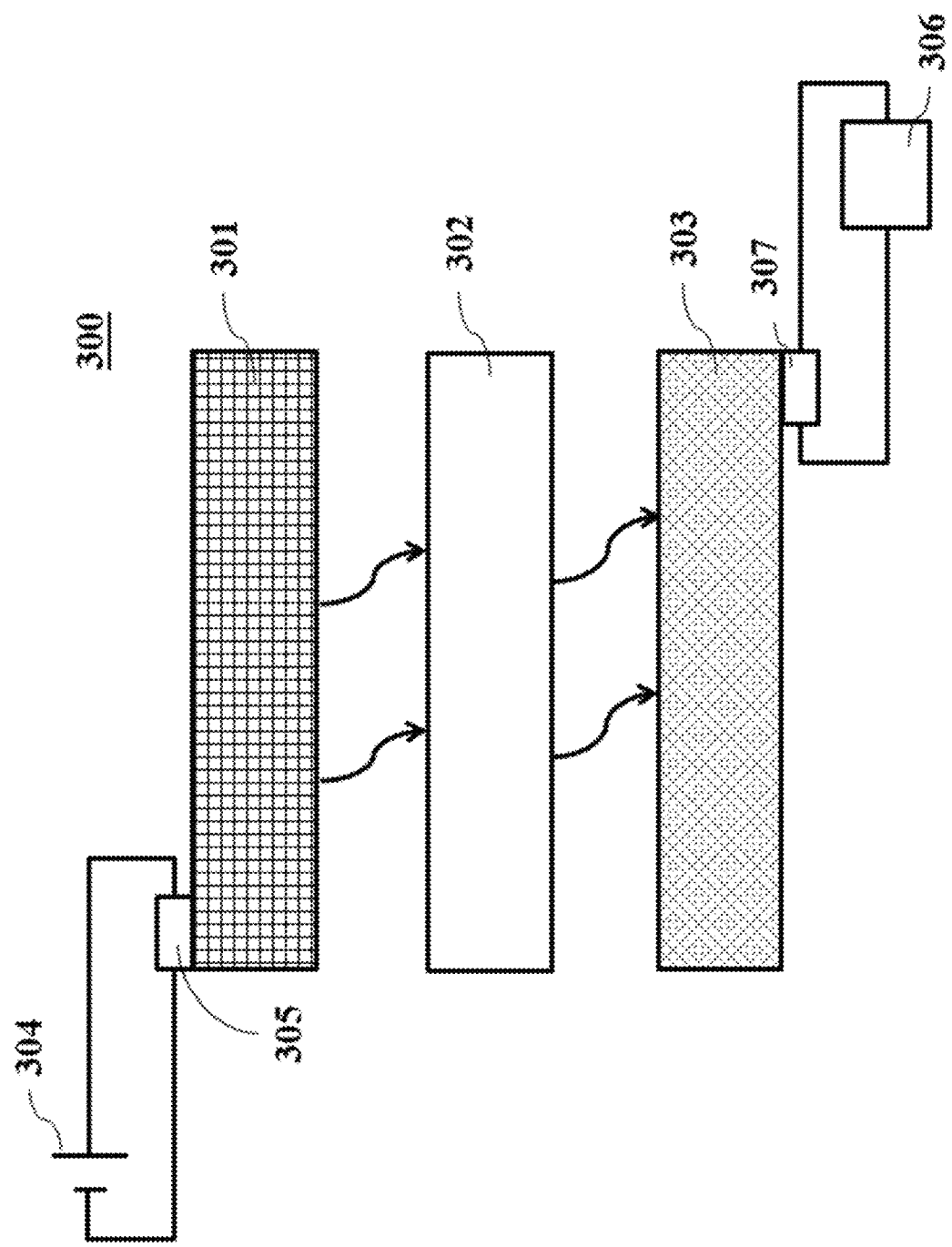
FIG. 3 shows an exemplary photon battery assembly in application.

FIG. 3 shows an exemplary photon battery assembly in application. Any and all circuits illustrated in FIG. 3 are not limited to such circuitry configurations. A photon battery assembly 300 can be charged by a power source 304 and discharge power to an electrical load 306. The photon battery assembly can comprise a light source 301, such as a LED or a set of LEDs. The light source can be in electrical communication with the power source 304 through a port 305 of the light source. For example, the power source and the port 305 can be electrically connected via a circuit. The power source 304 may be external or internal to the photon battery assembly 300. The power source can be a power supplying device, such as another energy storage system (e.g., another photon battery, lithium ion battery, supercapacitor, fuel cell, etc.). The power source can be an electrical grid.

The light source 301 can receive electrical energy and emit optical energy at a first wavelength, such as via a light-emitting surface of the light source. The light-emitting surface can be adjacent to a phosphorescent material 302. The light source can be in optical communication with the phosphorescent material. The phosphorescent material can be configured to absorb optical energy at the first wavelength and, after a time delay, emit optical energy at a second wavelength. In some cases, the rate of emission of the optical energy at the second wavelength can be slower than the rate of absorption of the optical energy at the first wavelength. An advantage of this difference in rate is the ability of the phosphorescent material to release energy at a slower rate than absorbing such energy, thus storing the energy during such time delay. In some instances, the phosphorescent material can store and/or discharge energy for at least about 1 hr, 2 hr, 3 hr, 4 hr, 5 hr, 6 hr, 7 hr, 8 hr, 9 hr, 10 hr, 11 hr, 12 hr, 1 day, 2 days, 3 days, 4 days, 1 week, 2 weeks, 3 weeks, or longer.

The photon battery assembly can comprise a photovoltaic cell 303. The photovoltaic cell can be configured to absorb optical energy at the second wavelength, such as via a light-absorbing surface of the photovoltaic cell. The photovoltaic cell can be in optical communication with the phosphorescent material 302. The light-absorbing surface of the photovoltaic cell can be adjacent to the phosphorescent material. The photovoltaic cell can generate electrical power from the optical energy absorbed. The electrical power generated by the photovoltaic cell can be used to power an electrical load 306. The photovoltaic cell can be in electrical communication with the electrical load through a port 307 of the photovoltaic cell. For example, the electrical load and the port 307 can be electrically connected via a circuit.

The energy stored by the photon battery assembly 300 can be charged and/or recharged multiple times. The power generated by the photon battery assembly can be consumed multiple times. The photon battery assembly can be charged and/or recharged by supplying electrical energy (or power) to the light source 301, such as through the port 305. The photon battery assembly 300 can discharge power by directing electrical power generated by the photovoltaic cell to the electrical load 306, such as through the port 307. For example, the photon battery assembly 300 can last (e.g., function for) at least 1, 2, 3, 4, 5, 6, 7, 8, 9, 10, 100, 500, 1000, $10^4$, $10^5$, $10^6$, or more recharge (or consumption) cycles.

The photon battery assembly 300 may provide superior charging rates to those of conventional chemical batteries, for example, on the order of 2, 3, 4, 5, 6, 7, 8, 9, 10, 20, 30, 40, 50, 60, 70, 80, 90, 100 times faster or more. For example, the photon battery assembly can charge at a speed of at least about 800 watts per cubic centimeters (W/cc), 850 W/cc, 900 W/cc, 1000 W/cc, 1050 W/cc, 1100 W/cc, 1150 W/cc, 1200 W/cc, 1250 W/cc, 1300 W/cc, 1350 W/cc, 1400 W/cc, 1450 W/cc, 1500 W/cc or greater. Alternatively, the photon battery assembly can charge at a speed of less than about 800 W/cc. The photon battery assembly may provide superior lifetimes to those of conventional chemical batteries, for example, on the order of 2, 3, 4, 5, 6, 7, 8, 9, 10 times more recharge cycles or more.

The photon battery assembly 300 may be stable and function effectively in relatively cold operating temperature conditions. For example, the photon battery assembly may function stably in operating temperatures as low as about −55° Celsius (° C.) and as high as about 65° C. The photon battery assembly may function stably in operating temperatures lower than about −55° C. and higher than about 65° C. In some instances, the photon battery assembly may function stably under any operating temperatures for which the light source (e.g., LEDs) functions stably. The photon battery assembly may not generate excess operating heat.

Figure 12:
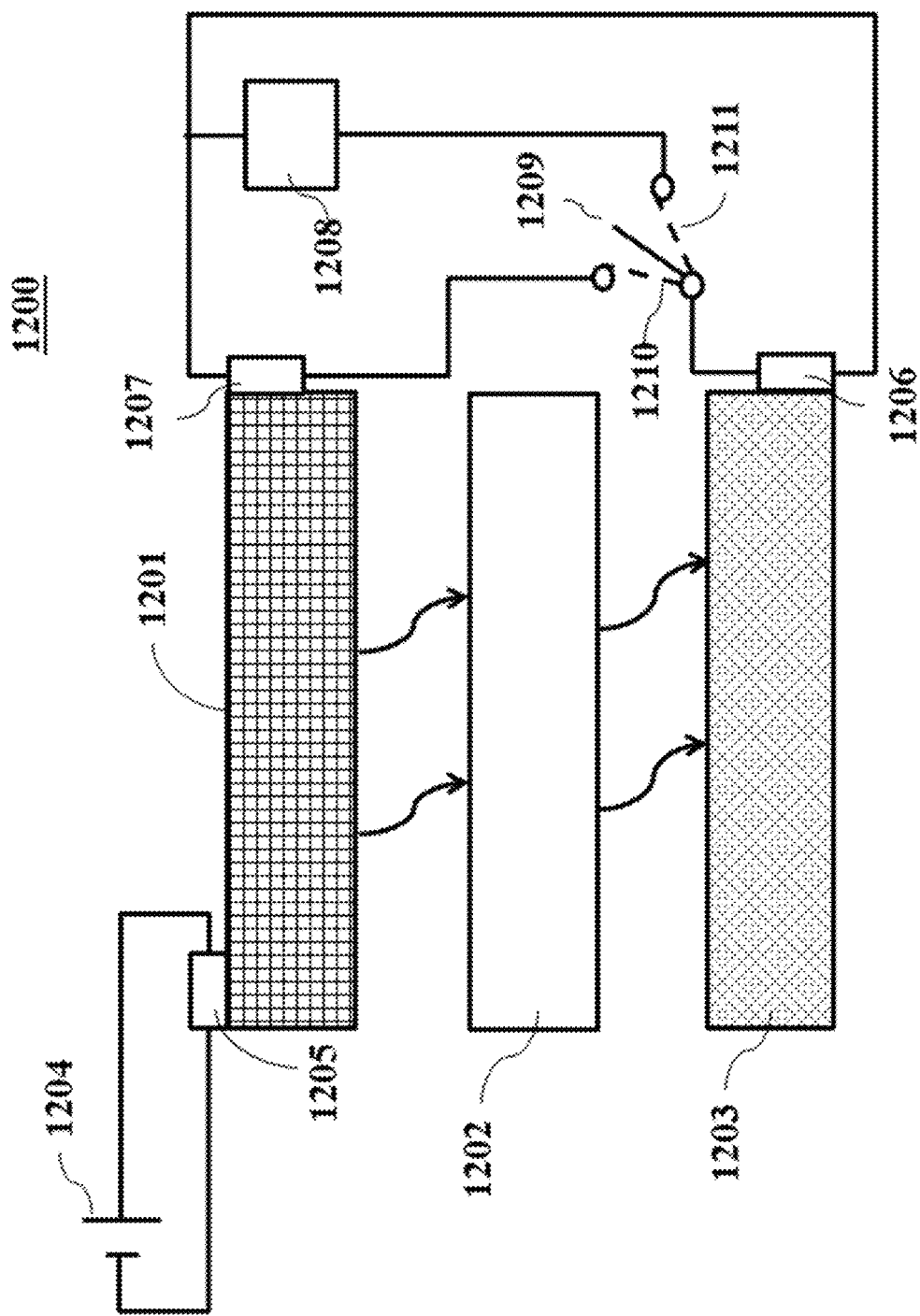
FIG. 12 shows an exemplary photon battery assembly that is self-sustaining in part.

FIG. 12 shows an exemplary photon battery assembly that is self-sustaining in part. Any and all circuits illustrated in FIG. 12 are not limited to such circuitry configurations. A photon battery assembly 1200 can be charged by a power source 1204 (e.g., electrical grid, different energy storage system such as a battery, etc.) and discharge power to an electrical load 1208. However, the electrical load 1208 or other electrical loads that may draw power from the photon battery assembly may not necessarily be connected to the photon battery assembly at all times. In some instances, the photon battery assembly may discharge more power than is consumed by the electrical load connected to the photon battery assembly. In such cases, at least some of the power generated by the photovoltaic cell 1203 can be wasted or lost from the energy storage system (e.g., photon battery assembly 1200). When no electrical load is connected to the photon battery assembly, in some instances, the power generated by the photon battery assembly can be directed back into the photon battery assembly. Alternatively or in addition, when an electrical load is consuming a less amount of power than is being produced by the photon assembly, some of the power can be directed into the photon battery assembly. For example, at least some power generated by the photovoltaic cell can be directed to power the light source 1201.

In some instances, the photon battery assembly 1200 in FIG. 12 and corresponding components thereof can parallel the photon battery assembly 300 in FIG. 3 and corresponding components thereof.

The photon battery assembly 1200 can comprise a light source 1201 powered primarily by a power source 1204, such as through a first port 1205 of the light source, a phosphorescent material 1202 adjacent to a light-emitting surface of the light source, and a photovoltaic cell 1203, which light-absorbing surface of the photovoltaic cell is adjacent to the phosphorescent material. The photovoltaic cell can discharge power to an electrical load 1208 when the electrical load is in electrical communication with the photovoltaic cell. The photovoltaic cell can discharge power to the light source when the electrical load is not in electrical communication with the photovoltaic cell.

For example, a circuitry of the photon battery assembly 1200 can comprise a switch 1209 that either completes a first electric path 1210 or a second electric path 1211. In some cases, the switch can complete neither electric path (e.g., as shown in FIG. 12), and when neither electric path is completed, the power generated by the photon battery assembly can be wasted or lost from the energy storage system. The first electric path 1210 can be completed when no electrical load (e.g., electrical load 1208) is connected to the photon battery assembly 1200. In some instances, completing the first electric path 1210 can be the default state of the switch 1209. When no electrical load is connected, the first electric path can be completed, thus directing the power generated by the photovoltaic cell 1203, such as through a port 1206 of the photovoltaic cell, to the light source 1201, such as through a second port 1207 of the light source. In some cases, the first port 1205 and the second port 1207 of the light source can be the same port.

The second electric path 1211 can be completed when at least one electrical load (e.g., electrical load 1208) is connected to the photon battery assembly 1200. In some instances, connecting an electrical load to the photon battery assembly can trigger the switch 1209 to alternate from a default path (or from completing a different electrical path) to completing the second electric path 1211. When an electrical load 1208 is connected, the second electric path can be completed, thus directing the power generated by the photovoltaic cell 1203, such as through the port 1206, to the electrical load 1208.

In some cases, the first electric path 1210 and the second electric path 1211 can be mutually exclusive. In some cases, a circuit can connect the port 1206 of the photovoltaic cell 1203, the second port 1207 of the light source 1201, and the electrical load 1208 in series or in parallel and simultaneously, or discretely, direct at least some power to the light source and direct at least some power to the electrical load, such as when more power is being discharged by the photovoltaic cell than is being consumed by the electrical load.

In some cases, the circuitry can be controlled manually (e.g., manual connection of electrical load to photon battery assembly, such as pushing in a cable, nudges a switch component into a circuit position). Alternatively or in addition, the circuitry can be controlled by a controller (not shown in FIG. 12). The controller may be capable of sensing the connection(s) of one or more electrical loads with the photon battery assembly. The controller may be capable of completing different electrical circuit paths (e.g., first electric path 1210, second electric path 1211, etc.), such as via controlling one or more switch components (e.g., switch 1209) or other electrical components.

The controller can comprise one or more processors and non-transitory computer readable medium communicatively coupled to the one or more processors. The controller, via the one or more processors and machine readable instructions stored in memory, can be capable of regulating different charging and/or discharging mechanisms of the photon battery assembly 1200. The controller may turn on an electrical connection between the light source 1201 and the power supply 1204 to start charging the photon battery assembly. The controller may turn off an electrical connection between the light source and the power supply to stop charging the photon battery assembly. The controller may turn on or off an electrical connection between the photovoltaic cell 1203 and the electrical load 1208. In some instances, the controller may be capable of detecting a charge level (or percentage) of the photon battery assembly. The controller may be capable of determining when the assembly is completely charged (or nearly completely charged) or discharged (or nearly completely discharged). For example, the photon battery assembly may further comprise a temperature sensor, heat sensor, optical sensor, or other type of sensor that is operatively coupled to the controller, wherein the sensors provide data indicative of charging level (or percentage). In some instances, the controller may be capable of maintaining a certain range of charge level (e.g., 5%~95%, 10%~90%, etc.) of the photon battery assembly, such as to maintain and/or increase the life of the photon battery assembly, which complete charge or complete discharge can detrimentally shorten. The controller may be capable of determining a power consumption rate of an electrical load and/or the light source. The controller may be configured to, based on such determination of power consumption rate, manipulate one or more circuitry in the photon battery assembly to direct power to the electrical load, the light source, both, and/or neither.

Figure 13:
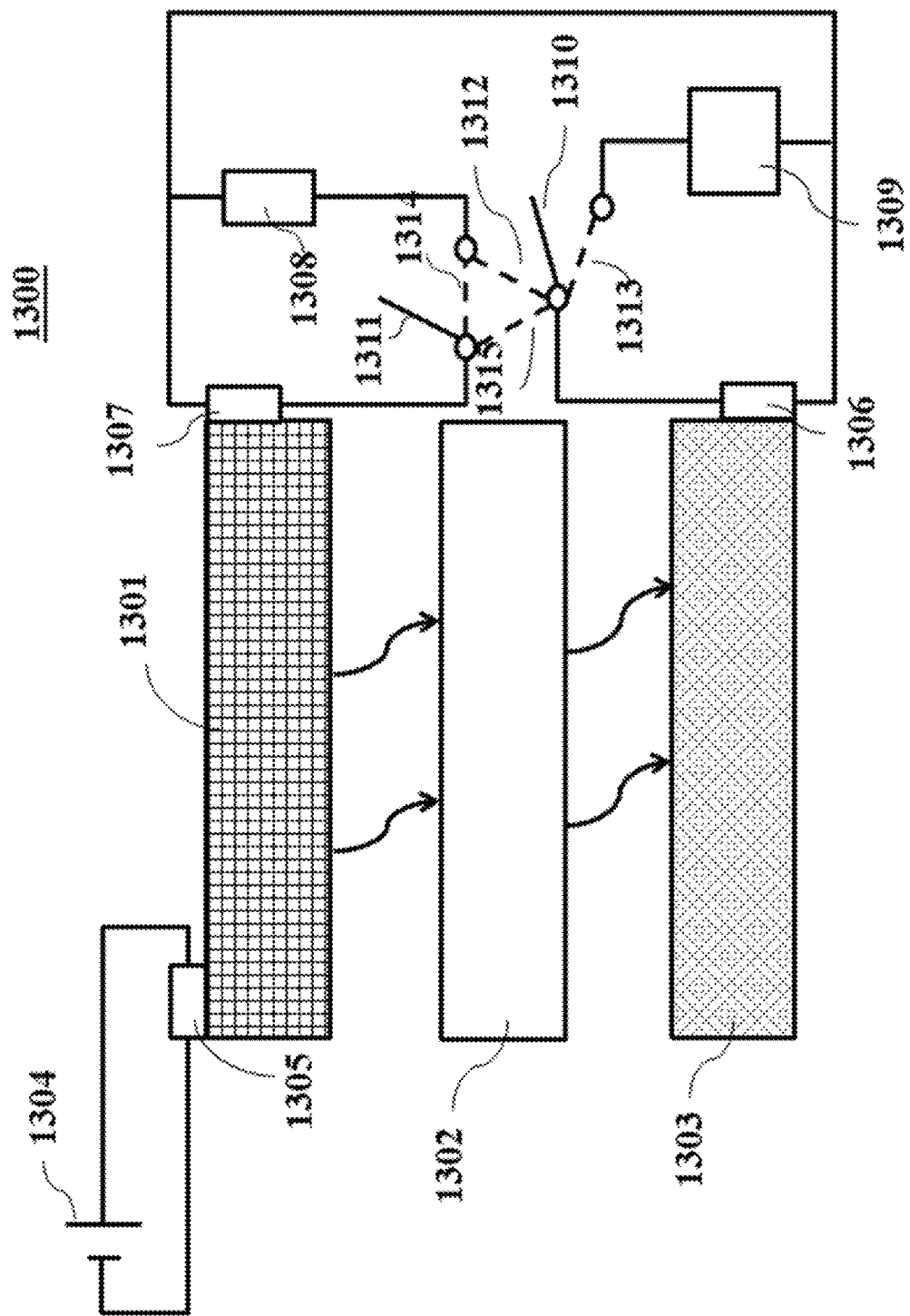
FIG. 13 shows an exemplary photon battery assembly in communication with a rechargeable battery.

FIG. 13 shows an exemplary photon battery assembly in communication with a rechargeable battery. Any and all circuits illustrated in FIG. 13 are not limited to such circuitry configurations. A photon battery assembly 1300 can be charged by a power source 1304 and discharge power to an electrical load 1309. However, the electrical load 1309 or other electrical loads that may draw power from the photon battery assembly may not necessarily be connected to the photon battery assembly at all times. In such cases, the power generated by the photovoltaic cell 1303 can be wasted or lost from the energy storage system (e.g., photon battery assembly 1300). When no electrical load is connected to the photon battery assembly, in some instances, the power generated by the photon battery assembly can be directed to charge a rechargeable battery 1308. For example, at least some power generated by the photovoltaic cell can be directed to charge the rechargeable battery 1308. The rechargeable battery 1308 can be electrically coupled to the photon battery assembly 1300 such that the rechargeable battery can, in some instances, supply power to a light source 1301, and in some instances, be charged by a photovoltaic cell 1303 of the photon battery assembly 1300. The rechargeable battery can be a lithium ion battery.

In some instances, the photon battery assembly 1300 in FIG. 13 and corresponding components thereof can parallel the photon battery assembly 300 in FIG. 3 and corresponding components thereof. In some instances, the photon battery assembly 1300 in FIG. 13 and corresponding components thereof can parallel the photon battery assembly 1200 in FIG. 12 and corresponding components thereof.

The photon battery assembly 1300 can comprise a light source 1301 powered primarily by a power source 1304, such as through a first port 1305 of the light source, a phosphorescent material 1302 adjacent to a light-emitting surface of the light source, and a photovoltaic cell 1303, which light-absorbing surface of the photovoltaic cell is adjacent to the phosphorescent material. The photovoltaic cell can discharge power to an electrical load 1309 when the electrical load is in electrical communication with the photovoltaic cell. The photovoltaic cell can discharge power to a rechargeable battery 1308 when the electrical load is not in electrical communication with the photovoltaic cell.

For example, a circuitry of the photon battery assembly 1300 can comprise a switch 1310 that either completes a first electric path 1312 or a second electric path 1313. In some cases, the switch can complete neither electric path (e.g., as shown in FIG. 13), and when neither electric path is completed, the power generated by the photon battery assembly can be wasted or lost from the energy storage system. The first electric path 1312 can be completed when no electrical load (e.g., electrical load 1309) is connected to the photon battery assembly 1300. In some instances, completing the first electric path 1312 can be the default state of the switch 1310. When no electrical load is connected, the first electric path can be completed, thus directing the power generated by the photovoltaic cell 1303, such as through a port 1306 of the photovoltaic cell, to the rechargeable battery 1308. The rechargeable battery can store the energy received from the photovoltaic cell. The rechargeable battery can discharge its own electrical power, such as to another electrical load, and/or back to the photon battery assembly 1300, such as through a second port 1307 of the light source 1301. In some instances, the second port 1307 and the first port 1305 of the light source can be the same port.

The second electric path 1313 can be completed when at least one electrical load (e.g., electrical load 1309) is connected to the photon battery assembly 1300. In some instances, connecting an electrical load to the photon battery assembly can trigger the switch 1310 to alternate from a default path (or from completing a different electrical path) to completing the second electric path 1313. When an electrical load 1309 is connected, the second electric path can be completed, thus directing the power generated by the photovoltaic cell 1303, such as through the port 1306, to the electrical load 1309.

In some cases, the first electric path 1312 and the second electric path 1313 can be mutually exclusive. In some cases, a circuit can connect the port 1306 of the photovoltaic cell 1303, the rechargeable battery 1308, and the electrical load 1309 in series or in parallel and simultaneously, or discretely, direct at least some power to the rechargeable battery and direct at least some power to the electrical load.

Alternatively or in addition, a circuitry of the photon battery assembly 1300 can comprise a switch 1311 that either completes a third electric path 1314 or a fourth electric path 1315. In some cases, the switch can complete neither electric path (e.g., as shown in FIG. 13), and when neither electric path is completed, the power generated by the photon battery assembly can be wasted or lost from the energy storage system. In some instances, completing the third electric path 1314 can be the default state of the switch 1311. When the third electric path is completed, power generated by the rechargeable battery 1308 can be directed to the photon battery assembly 1300, such as through the second port 1307 of the light source 1301. In some instances, the second port 1307 and the first port 1305 of the light source can be the same port. When the fourth electric path 1315 is completed, the power generated by the photovoltaic cell 1303, such as through the port 1306, can be directed back to the photon battery assembly 1300, such as through the second port 1307 of the light source 501.

In some cases, the first electric path 1312, the second electric path 1313, the third electric path 1314, and the fourth electric path 1315 can be mutually exclusive. In some cases, a circuit can connect the port 1306 of the photovoltaic cell 1303, the rechargeable battery 1308, the electrical load 1309, the second port 1307 of the light source 1301, or any combination thereof in series or in parallel and simultaneously, or discretely, direct at least some power to or from different components.

In some cases, the circuitry can be controlled manually (e.g., manual connection of electrical load to photon battery assembly, such as pushing in a cable, nudges a switch component into a circuit position). Alternatively or in addition, the circuitry can be controlled by a controller (not shown in FIG. 13). The controller may be capable of sensing the connection(s) of one or more electrical loads with the photon battery assembly. The controller may be capable of sensing the connection(s) of one or more rechargeable batteries with the photon battery assembly and/or the one or more electrical loads. The controller may be capable of completing different electrical circuit paths (e.g., first electric path 1312, second electric path 1313, third electric path 1314, fourth electric path 1315, etc.), such as via controlling one or more switch components (e.g., switch 1310, switch 1311, etc.) or other electrical components.

Figure 14:
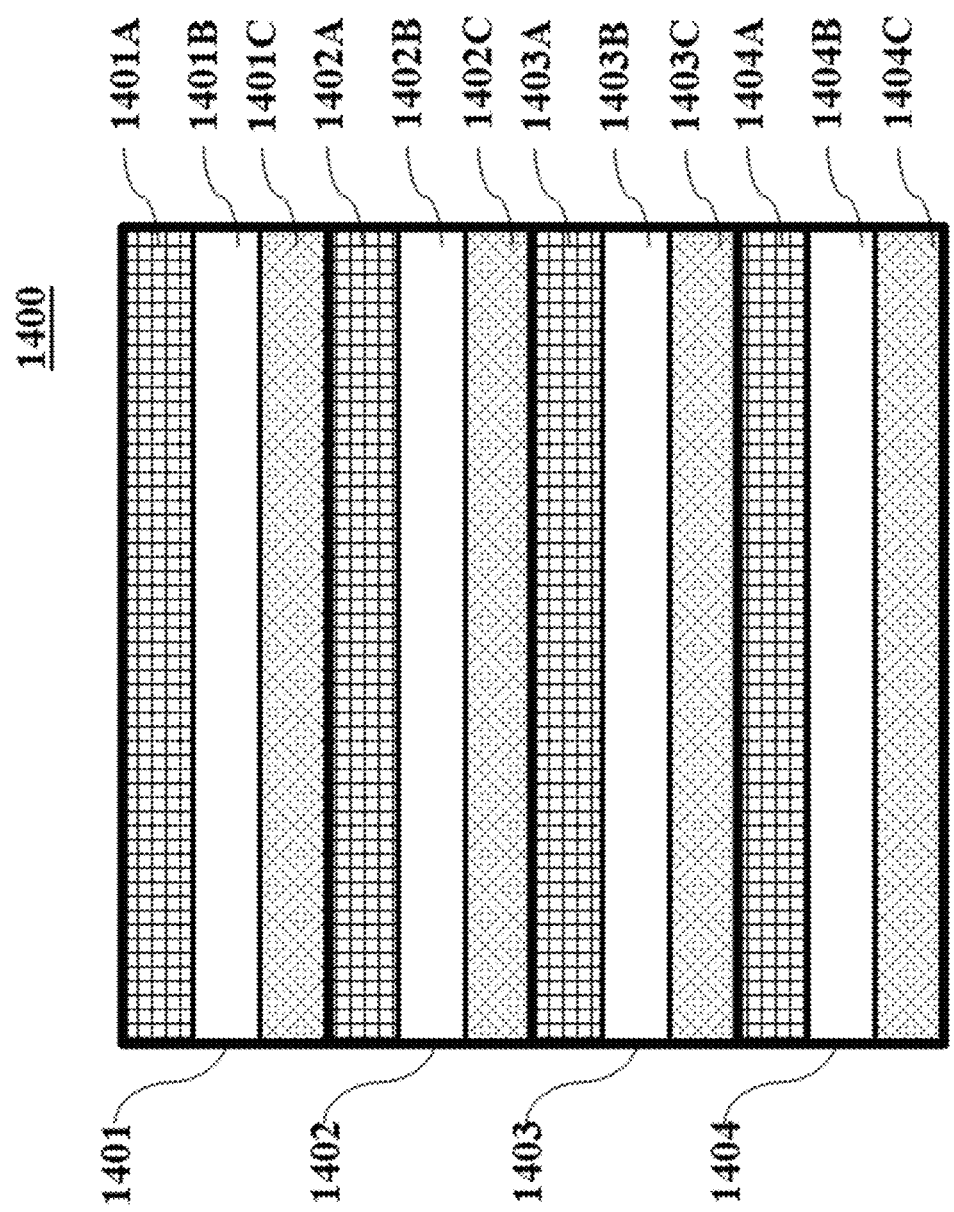
FIG. 14 shows a stack of a plurality of photon battery assemblies.

FIG. 14 shows a stack of a plurality of photon battery assemblies. A photon battery assembly can be connected to achieve different desired voltages, energy storage capacities, power densities, and/or other battery properties. For example, an energy storage system 1400 comprises a stack of a first photon battery assembly 1401, a second photon battery assembly 1402, a third photon battery assembly 1401, and a fourth photon battery assembly 1401. The first photon battery assembly can comprise its own light source 1401A, phosphorescent material 1401B, and photovoltaic cell 1401C. Similarly, the second photon battery assembly can comprise its own light source 1402A, phosphorescent material 1402B, and photovoltaic cell 1402C. Similarly, the third photon battery assembly can comprise its own light source 1403A, phosphorescent material 1403B, and photovoltaic cell 1403C. Similarly, the fourth photon battery assembly can comprise its own light source 1404A, phosphorescent material 1404B, and photovoltaic cell 1404C. While FIG. 14 shows four photon battery assemblies stacked together, any number of photon battery assemblies can be stacked together. For example, at least 2, 3, 4, 5, 6, 7, 8, 9, 10, 15, 20, 25, 30, 35, 40, 45, 50, 100, 200, or more photon battery assemblies can be stacked together.

Each photon battery assembly can be configured as described in FIGS. 1-3 and 12-13. Alternatively, different components of the photon battery assembly (e.g., light source, phosphorescent material, photovoltaic cell) can be stacked in different configurations (e.g., orders) such that any phosphorescent material layer is adjacent to both a light source layer and a photovoltaic cell layer. For example, a first photovoltaic cell layer can be adjacent to a first phosphorescent material layer, which is also adjacent to a light source layer, which is also adjacent to a second phosphorescent material layer, which is also adjacent to a second photovoltaic cell layer. As in the example above, a phosphorescent material layer can act as intermediary layers between alternating layers of the photovoltaic cell and the light source. For example, a light source can have at least two light-emitting surfaces that are each in optical communication with distinct phosphorescent materials (e.g., different volumes of phosphorescent materials). For example, a photovoltaic cell can have at least two light-absorbing surfaces that are each in optical communication with distinct phosphorescent materials (e.g., different volumes of phosphorescent materials).

A plurality of photon battery assemblies can be electrically connected in series, in parallel, or a combination thereof. While FIG. 14 shows a vertical stack, the assemblies can be stacked in different configurations, such as in horizontal stacks on in concentric (or circular) stacks. In some instances, there may be interconnects and/or other electrical components between each photon battery assembly. In some instances, a controller can be electrically coupled to one or more photon battery assemblies (e.g., 1401, 1402, 1403, 1404, etc.) and be capable of managing the inflow and/or outflow of power from each or a combination of the battery assemblies.

As described elsewhere herein, photovoltaic cells in a photon battery assembly generate electrical power by absorbing optical energy from the phosphorescent material. However, if the phosphorescent material is too thick in depth, the optical energy emitted by the phosphorescent material may not be efficiently absorbed by the photovoltaic cell, due in part to other phosphorescent material obstructing optical paths to one or more light-absorbing surfaces of the photovoltaic cell. For example, the photons emitted by the outermost material (closest to the interface between the light absorbing surface of the photovoltaic cell and the phosphorescent material) of the phosphorescent material may be absorbed with less resistance than the photons emitted by the inner material (farthest from the interface between the phosphorescent material and the photovoltaic cell). Therefore, in some instances, it may be beneficial to have a relatively thin layer of phosphorescent material interfacing with a relatively large surface area of a light-absorbing surface of the photovoltaic cells. Provided herein are trench-like configurations of the photon battery assembly that can increase interfacial surface area between the phosphorescent material and the photovoltaic cells, thus allowing for more efficient absorption of optical energy by the photovoltaic cells.

Figure 15:
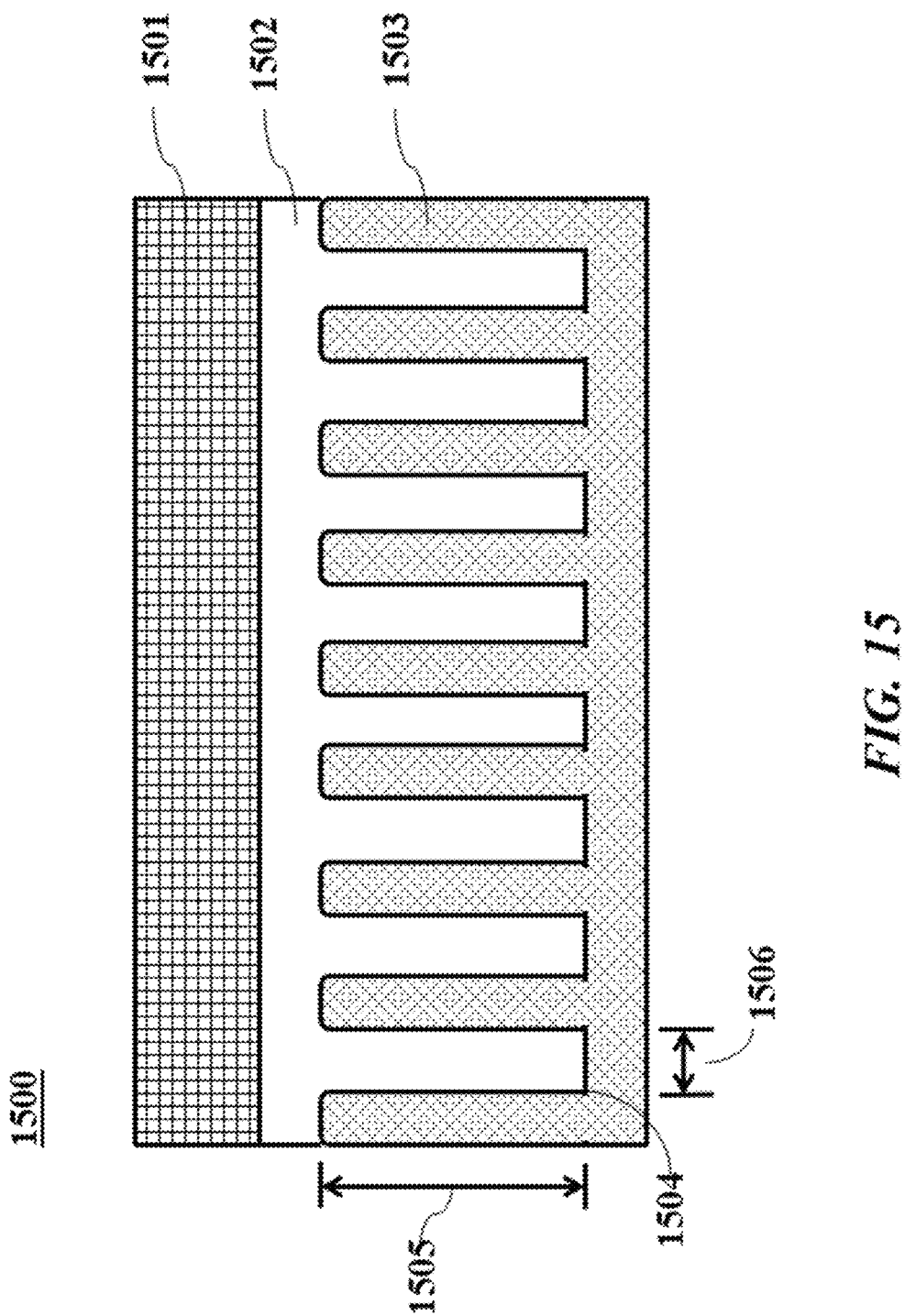
FIG. 15 shows a cross-sectional side view of an exemplary trench configuration of a photon battery assembly.
Figure 16:
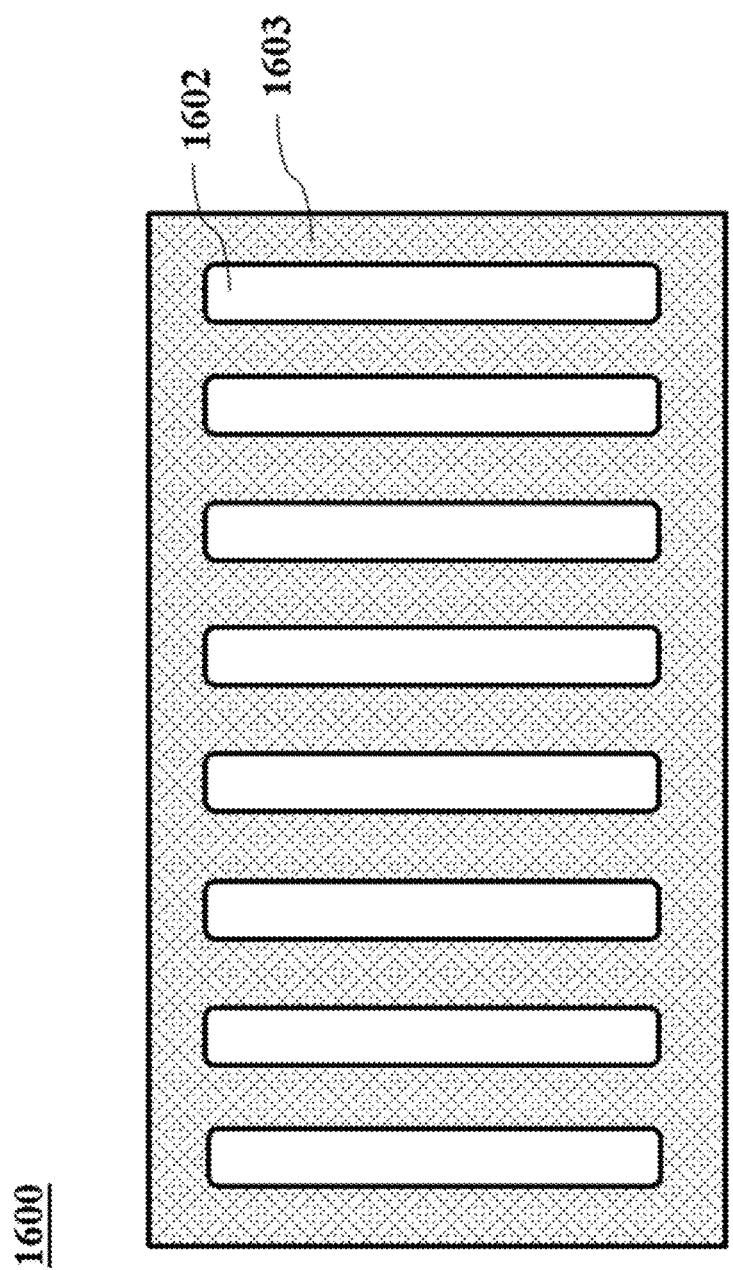
FIG. 16 shows a cross-sectional top view of an exemplary trench configuration of a photon battery assembly.

FIG. 15 shows a cross-sectional side view of an exemplary trench configuration of a photon battery assembly and FIG. 16 shows a cross-sectional top view of an exemplary trench configuration of a photon battery assembly. FIG. 15 and FIG. 16 may or may not be different views of the same trench configuration of a photon battery.

Referring to FIG. 15, a photon battery assembly 1500 comprises a light source 1501 (e.g., LEDs), phosphorescent material 1502, and photovoltaic cells 1503. As described elsewhere herein, a light-emitting surface of the light source can be adjacent to the phosphorescent material, and a light absorbing surface of the photovoltaic cells can be adjacent to the phosphorescent material.

In some instances, the photovoltaic cells 1503 can comprise one or more depressions defined by corresponding protrusions. The depressions and/or the corresponding protrusions can be defined by the light-absorbing surface of the photovoltaic cells. For example, the photovoltaic cells can comprise one or more troughs and/or peaks. Alternatively or in addition, the photovoltaic cells can comprise grooves, cuts, trenches, wells, and/or other characterizations of depressions. A depression can be formed by etching, cutting, carving, digging, excavating, molding, pressurizing, and/or other mechanical methods. Alternatively or in addition, a depression can be formed by constructing, building, and/or assembling the photovoltaic cells to comprise the depression.

In some instances, a depth 1505 of a depression 1504 may be 100 times longer than a maximum width 1505 (or diameter) of the depression 1504. In some instances, a depth of a depression may be at least 2, 3, 4, 5, 6, 7, 8, 9, 10, 11, 12, 13, 14, 15, 20, 30, 40, 50, 60, 70, 80, 90, 100, 150, 200, 300, 400, 500, 600, 700, 800, 900, 1000 or more times longer than a maximum width of the depression. In some instances, a maximum width of a depression can be at least about 50 nanometers (nm), 60 nm, 70 nm, 80 nm, 90 nm, 100 nm, 110 nm, 120 nm, 130 nm, 140 nm, 150 nm, 200 nm, 300 nm, 400 nm, 500 nm, 600 nm, 700 nm, 800 nm, 900 nm, 1 millimeter (mm), 1.1 mm, 1.2 mm, 1.3 mm, 1.4 mm, 1.5 mm, 1.6 mm, 1.7 mm, 1.8 mm, 1.9 mm, 2.0 mm or greater. Alternatively, the maximum width of a depression can be less than about 50 nm. In some instances, a depth of a depression can be at least about 1 mm, 2 mm, 3 mm, 4 mm, 5 mm, 6 mm, 7 mm, 8 mm, 9 mm, 1 centimeter (cm), or greater. Alternatively, the depth of a depression can be less than about 1 mm. In some instances, a maximum width of a depression may be substantially the same as a maximum width of a protrusion. Alternatively, a maximum width of a depression may be at least 1%, 2%, 3%, 4%, 5%, 6%, 7%, 8%, 9%, 10%, 20%, 30%, 40%, 50%, 60%, 70%, 80%, 90%, 100%, 200%, 300%, 400%, 500%, 1000%, 2000%, 3000%, 4000%, 5000% or more greater than a maximum width of a protrusion. Alternatively, the maximum width of a depression may less than the maximum width of a protrusion. In some instances, the photovoltaic cell 1503 can comprise at least about 1, 2, 3, 4, 5, 6, 7, 8, 8, 10, 11, 12, 13, 14, 15, 20, 30, 40, 50, 60, 70, 80, 90, 100, 150, 200, 300, 400, 500, 600, 700, 800, 900, 1000, 2000, 3000, 4000, 5000, 6000, 7000, 8000, 9000, 10,000, 20,0000, or more depressions per centimeter length of the photovoltaic cell. Alternatively, the photovoltaic cell can comprise less than about 1 depression per centimeter length of the photovoltaic cell.

While FIG. 15 shows a certain number of depressions in the photovoltaic cell structure, the number of depressions in the photovoltaic cells is not restricted as such. The phosphorescent material 1502 can interface with the significantly larger surface area of the light-absorbing surfaces of the photovoltaic cell 1503 which define the depressions and/or corresponding protrusions, at least when compared to the surface area of planar light-absorbing surfaces of the photovoltaic cell (such as in FIG. 1).

In some embodiments, the photovoltaic cell 1503 may be contacting the light source 1501 (not shown in FIG. 15). For example, one or more light-emitting surfaces of the light source 1501 can cap or cover the depressions (or wells) of the photovoltaic cell 1503 by contacting the top (or peak) of the one or more protrusions defining the depressions. The light source can be in any configuration in which the phosphorescent material 1502 is in optical communication with the light source. In some instances, if the phosphorescent material is capable of absorbing natural light, the light source may not be required in the assembly, and the photon battery assembly 1500 can be in any configuration in which the phosphorescent material is in optical communication with a natural light source (e.g., sunlight).

As described elsewhere herein, phosphorescent material 1502 in a photon battery assembly 700 store energy over a finite duration of time by absorbing optical energy at a first wavelength from a light source 1501 and, after a time delay, emitting optical energy at a second wavelength, such as to photovoltaic cells 1503. However, if the phosphorescent material is too thick in depth, the optical energy emitted by the light source may not be efficiently absorbed by the phosphorescent material, due in part to other phosphorescent material obstructing optical paths from one or more light-emitting surfaces of the light source. For example, the photons emitted by the light source may be absorbed with less resistance by the outermost material (closest to the interface between the light emitting surface of the light source and the phosphorescent material) of the phosphorescent material than by the inner material (farthest from the interface between the phosphorescent material and the light source). Therefore, in some instances, it may be beneficial to have a relatively thin layer of phosphorescent material interfacing with a relatively large surface area of a light-emitting surface of the light source.

In some embodiments (not shown in FIG. 15), the light source 1501 may comprise one or more depressions defined by corresponding protrusions. The depressions and/or corresponding protrusions can be defined by light-emitting surfaces of the light source. For example, the light source can comprise one or more troughs and/or peaks. In some instances, a depth of a depression may be 100 times longer than a maximum width (or diameter) of the depression. The phosphorescent material 1502 can interface with the significantly larger surface area of the light-emitting surfaces of the light source 1501 which define the depressions and/or corresponding protrusions, at least when compared to the surface area of planar light-emitting surfaces of the light source (such as in FIG. 1 and FIG. 15), thus allowing for more efficient absorption of optical energy by the phosphorescent material.

In some embodiments (not shown in FIG. 15), both the light source 1501 and the photovoltaic cells 1503 may comprise one or more depressions defined by corresponding protrusions. In some instances, the depressions and/or corresponding protrusions defined by the light source can be complementary to the depressions and/or corresponding protrusions defined by the photovoltaic cells. For example, a protrusion of the light source may fit, with at least some room, within a depression of the photovoltaic cells, wherein the phosphorescent material lies within the at least some room between the light source and the photovoltaic cells. Alternatively or in addition, a protrusion of the photovoltaic cells may fit, with at least some room, within a depression of the light source, wherein the phosphorescent material lies within the at least some room between the light source and the photovoltaic cells. Beneficially, such configurations can increase the interfacial surface areas both between the phosphorescent material and the light source and between the phosphorescent material and the photovoltaic cells, thus allowing for more efficient absorption and emission of optical energy by the phosphorescent material as well as efficient absorption of optical energy by the photovoltaic cells.

Referring to FIG. 16, a cross-sectional top view of a trench configuration of a photon battery assembly is shown. A photon battery assembly 1600 comprises a light source (not shown in FIG. 16), phosphorescent material 1602, and photovoltaic cells 1603. As described elsewhere herein, a light-emitting surface of the light source can be adjacent to the phosphorescent material, and a light absorbing surface of the photovoltaic cells can be adjacent to the phosphorescent material. The photovoltaic cell may comprise one or more depressions that go into the plane of FIG. 16 and one or more corresponding protrusions that come out of the plane of FIG. 16. In some cases, a depression may be elongated in at least one dimension (that is not the depth) and aligned in a horizontal or vertical array, such as is shown in FIG. 16. The depression may not be elongated. In some cases, depressions may be aligned in a grid having at least two axes (e.g., horizontal and vertical axes, x and y axes) that may or may not be at right angles to each other.

Alternatively or in addition, the phosphorescent material may interface with a light-absorbing surface of the photovoltaic cell that has any other shape, form, or structure, such as a planar structure (e.g., as in the photovoltaic cell 103 shown in FIG. 1). The other shape, form, or structure may increase interfacial surface area between the phosphorescent material and the photovoltaic cell than a planar structure within the same reference volume. Alternatively or in addition, the phosphorescent material may interface with a light-emitting surface of the light source that has any other shape, form, or structure, such as a planar structure (e.g., as in the light source 101 shown in FIG. 1). The other shape, form, or structure may increase interfacial surface area between the phosphorescent material and the light source than a planar structure within the same reference volume.

Battery assemblies are described in U.S. Patent Pub. No. 2018/0308601, which is entirely incorporated herein by reference for all purposes.

Figure 4A:
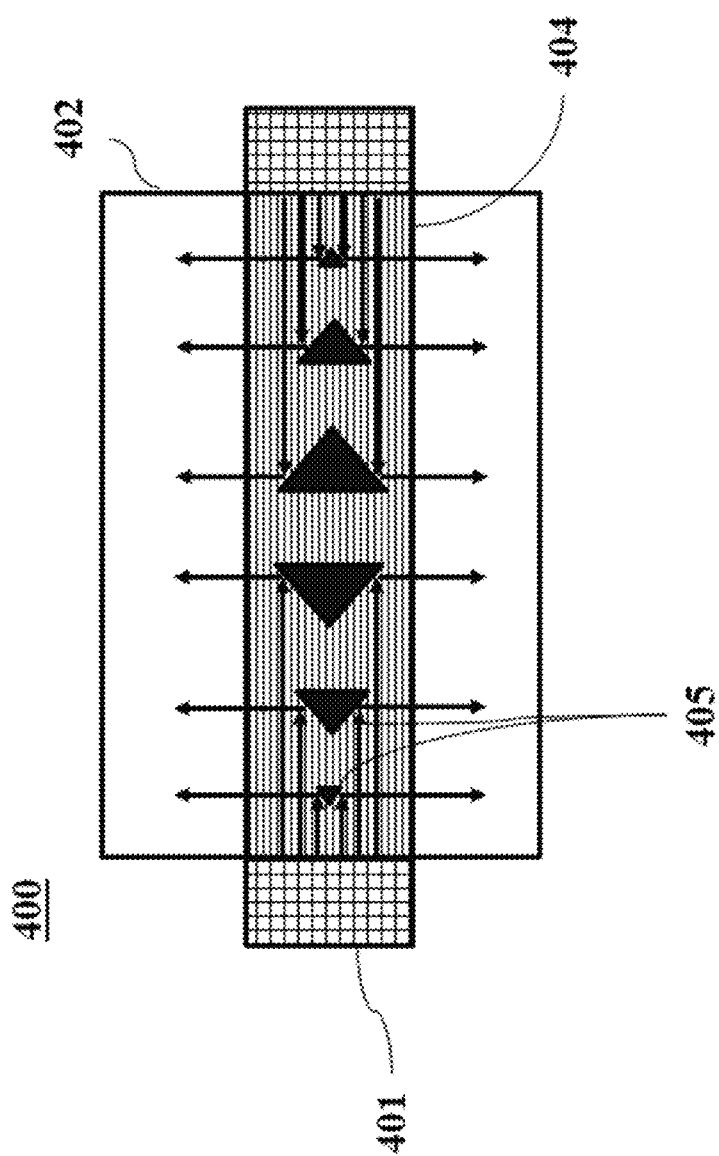
FIG. 4A illustrates a photon battery assembly with a waveguide.

FIG. 4A illustrates a photon battery assembly with a waveguide. A photon battery assembly 400 can comprise a light source 401, a phosphorescent material 402, a photovoltaic cell (not shown), and a waveguide 404. The waveguide may be adjacent to the light source and the phosphorescent material. For example, the waveguide may be sandwiched by the light source and the phosphorescent material. In other examples, as shown in FIG. 4A, some surfaces of the waveguide may be adjacent to the phosphorescent material and some surfaces of the waveguide may be adjacent to the light source. In some instances, additionally, the waveguide may be adjacent to the photovoltaic cell. The configuration of the photon battery assembly with the waveguide is not limited to FIG. 4A.

Regardless of contact between the phosphorescent material 402 and waveguide 404, the phosphorescent material and the waveguide may be in optical communication. Regardless of contact between the light source 401 and waveguide, the light source and the waveguide may be in optical communication. In some instances, regardless of contact between the photovoltaic cell and waveguide, the photovoltaic cell and the waveguide may be in optical communication.

The waveguide 404 may or may not be contacting the light source 401. If the waveguide and the light source are in contact, the waveguide can interface a light-emitting surface of the light source. The waveguide and the light source can be coupled or fastened together at the interface, such as via a fastening mechanism. In some instances, a support carrying the light source and/or a support carrying the waveguide may be coupled or fastened together at the interface. Examples of fastening mechanisms may include, but are not limited to, form-fitting pairs, hooks and loops, latches, staples, clips, clamps, prongs, rings, brads, rubber bands, rivets, grommets, pins, ties, snaps, velcro, adhesives, tapes, a combination thereof, or any other types of fastening mechanisms. In some instances, the waveguide may have adhesive and/or cohesive properties and adhere to the light source without an independent fastening mechanism. The waveguide and the light source can be permanently or detachably fastened together. For example, the waveguide and the light source can be disassembled from and reassembled into the photon battery assembly 400 without damage (or with minimal damage) to waveguide and/or the light source. Alternatively, while in contact, the waveguide and the light source may not be fastened together.

If the waveguide 404 and the light source 401 are not in contact, the waveguide can otherwise be in optical communication with a light-emitting surface of the light source. For example, the waveguide can be positioned in an optical path of light emitted by the light-emitting surface of the light source. In some instances, there can be an air gap between the waveguide and the light source. In some instances, there can be another intermediary layer, such as a solid material (e.g., glass, plastic, etc.) and/or another waveguide, between the waveguide and the light source. The intermediary layer can be air and/or other fluid. The intermediary layer can be a light guide or another layer of optical elements (e.g., lens, reflector, diffusor, beam splitter, etc.). In some instances, there can be a plurality of intermediary layers between the waveguide and the light source. In some instances, the waveguide may be in optical communication with one or more surfaces of the waveguide. For example, the light source may comprise an array and/or row of LEDs that are in optical communication with one or more surfaces of the waveguide. The waveguide may receive light from the light source from any surface. In some instances, a surface of the waveguide in optical communication with a surface of a light source may be parallel, perpendicular, or at any angle whether in direct contact or not in contact. Either or both surfaces may be flat. Either or both surfaces may be angled and/or have a curvature (e.g., convex, concave). Either or both surfaces may have any surface profile.

The waveguide 404 may or may not be contacting the phosphorescent material 402. If the waveguide and the phosphorescent material are in contact, the waveguide can interface a light-absorbing surface of the phosphorescent material. The waveguide and the phosphorescent material can be coupled or fastened together at the interface, such as via a fastening mechanism. In some instances, a support carrying the phosphorescent material and/or a support carrying the waveguide may be coupled or fastened together at the interface. Examples of fastening mechanisms may include, but are not limited to, form-fitting pairs, hooks and loops, latches, staples, clips, clamps, prongs, rings, brads, rubber bands, rivets, grommets, pins, ties, snaps, velcro, adhesives, tapes, a combination thereof, or any other types of fastening mechanisms. In some instances, the waveguide may have adhesive and/or cohesive properties and adhere to the phosphorescent material without an independent fastening mechanism. In some instances, the phosphorescent material may have adhesive and/or cohesive properties and adhere to the waveguide without an independent fastening mechanism. For example, the phosphorescent material may be painted or coated on a light-emitting surface of the waveguide. The waveguide and the phosphorescent material can be permanently or detachably fastened together. For example, the waveguide and the phosphorescent material can be disassembled from and reassembled into the photon battery assembly 400 without damage (or with minimal damage) to waveguide and/or the phosphorescent material. Alternatively, while in contact, the waveguide and the phosphorescent material may not be fastened together.

If the waveguide 404 and the phosphorescent material 402 are not in contact, the waveguide can otherwise be in optical communication with a light-absorbing surface of the phosphorescent material. For example, the phosphorescent material can be positioned in an optical path of light emitted by the light-emitting surface of the waveguide. In some instances, there can be an air gap between the waveguide and the phosphorescent material. In some instances, there can be another intermediary layer, such as another waveguide, between the waveguide and the phosphorescent material. The intermediary layer can be air or other fluid. The intermediary layer can be a light guide or another layer of optical elements (e.g., lens, reflector, diffusor, beam splitter, etc.). In some instances, there can be a plurality of intermediary layers between the waveguide and the phosphorescent material. In some instances, the waveguide may be in optical communication with one or more surfaces of the phosphorescent material. The phosphorescent material may receive light from the waveguide from any surface. In some instances, a surface of the waveguide in optical communication with a surface of a phosphorescent material may be parallel, perpendicular, or at any angle, whether in direct contact or not in contact. Either or both surfaces may be flat. Either or both surfaces may be angled and/or have a curvature (e.g., convex, concave). Either or both surfaces may have any surface profile.

The waveguide 404 may be configured to direct waves at a first wavelength emitted from the light source 401 to the phosphorescent material 402. Beneficially, the waveguide may deliver optical energy from the light source to the phosphorescent material with great efficiency and minimal loss of optical energy (or other forms of energy). The waveguide may provide optical communication between the light source and distributed volumes of the phosphorescent material where otherwise some volumes of phosphorescent material would not be in optical communication with the light source, allowing for flexible arrangements of the light source relative to the phosphorescent material. For example, without waveguides, the optical energy at the first wavelength emitted from the light source may be absorbed most efficiently by the immediately adjacent volume of phosphorescent material (relative to the light source or otherwise in immediate optical communication with the light source), such as at the phosphorescent material-light source interface. However, once such immediately adjacent phosphorescent material absorbs the optical energy at the first wavelength, it may no longer have capacity to receive further optical energy and/or prevent other volumes of phosphorescent material (further downstream in the optical path) from absorbing such optical energy. While large surface area interface between the phosphorescent material and the light source may facilitate efficient optical energy delivery from the light source to the phosphorescent material, this may be impractical when constructing compact energy storage systems. By implementing waveguides to facilitate optical communication between the light source and the phosphorescent material, different volumes of the phosphorescent material may evenly absorb the optical energy from the light source even if such phosphorescent material and the light source are not immediately adjacent.

The waveguide 404 may have a maximum dimension (e.g., width, length, height, radius, diameter, etc.) of at least about 10 micrometers, 20 micrometers, 30 micrometers, 40 micrometers, 50 micrometers, 60 micrometers, 70 micrometers, 80 micrometers, 90 micrometers, 100 micrometers, 200 micrometers, 300 micrometers, 400 micrometers, 500 micrometers, 600 micrometers, 700 micrometers, 800 micrometers, 900 micrometers, 1 millimeter (mm), 2 mm, 3 mm, 4 mm, 5 mm, 6 mm, 7 mm, 8 mm, 9 mm, 1 centimeter (cm), 2 cm, 3 cm, 4 cm, 5 cm, 10 cm, 15 cm, 20 cm, 30 cm, 40 cm, 50 cm or more. Alternatively or in addition, the waveguide may have a maximum dimension of at most about 50 cm, 40 cm, 30 cm, 20 cm, 15 cm, 10 cm, 5 cm, 4 cm, 3 cm, 2 cm, 1 cm, 9 mm, 8 mm, 7 mm, 6 mm, 5 mm, 4 mm, 3 mm, 2 mm, 1 mm, 900 micrometers, 800 micrometers, 700 micrometers, 600 micrometers, 500 micrometers, 400 micrometers, 300 micrometers, 200 micrometers, 100 micrometers, 90 micrometers, 80 micrometers, 70 micrometers, 60 micrometers, 50 micrometers, 40 micrometers, 30 micrometers, 20 micrometers, 10 micrometers, or less. The waveguide may be square, rectangular (e.g., having an aspect ratio for length to width of about 1:1.1, 1:1.2, 1:1.3, 1:1.4, 1:1.5, 1:1.6, 1:1.7, 1:1.8, 1:1.9, 1:2, 1:3, 1:4, 1:5, 1:10, etc.), or any other shape. The waveguide may comprise material such as plastic or glass. The waveguide may comprise material used in an injection mold.

For example, in FIG. 4A, the optical energy emitted from the light source 401 is directed through the layer of waveguide 404 to reach various locations of the phosphorescent material 402. As described elsewhere herein, after a time delay, the phosphorescent material 402 may emit optical energy at the second wavelength for absorption by a photovoltaic cell (not shown). The waveguide may comprise one or more reflective surfaces 405 to direct waves from the light source to the phosphorescent material. The one or more reflective surfaces may have increasingly large reflective surfaces in the optical path within the waveguide to allow some waves to be reflected at a first reflective surface for excitation of a first volume of phosphorescent material, and some waves to travel further before being reflected at a second reflective surface for excitation of a second volume of phosphorescent material that is further from the light source than the first volume, and some waves to travel further before being reflected at a third reflective surface for excitation of a third volume of phosphorescent material that is further than the second volume, and so on. There may be any number of reflective surfaces in the waveguide. For example, there may be at least about 3, 4, 5, 6, 7, 8, 9, 10, 20, 30, 40, 50, 60, 70, 80, 90, 100, 200, 300, 400, 500, or more reflective surfaces. Alternatively or in addition, a single reflective surface may gradually increase surface area, such as in a conical shape, in the optical path within the waveguide to achieve a similar outcome.

In some instances, the waveguide may be adjacent to the phosphorescent material from a first surface, and adjacent to the light source from a second surface, wherein the first surface and the second surface are substantially orthogonal. The one or more reflective surfaces may be configured to direct waves in a substantially orthogonal direction such as to receive from the light source from the second surface and to transmit through the first surface. Alternatively or in addition, the first surface and the second surface may be at any other angle and the one or more reflective surfaces may be configured to direct waves in the other angle, such as to receive from the light source from the second surface and to transmit through the first surface. As illustrated in FIG. 4A, the waveguide may be adjacent to a plurality of layers of phosphorescent material (e.g., interfacing different surfaces of the waveguide). The one or more reflective surfaces may be configured to direct waves received from the light source to the plurality of layers of phosphorescent material by reflecting the waves (e.g., light) to the plurality of layers.

In some instances, alternative to or in addition to the light source 401, the photon battery assembly 400 may be charged (or the phosphorescent material excited) wirelessly. In some embodiments, a photon battery assembly can comprise the phosphorescent material 402, a photovoltaic cell (not shown), and the waveguide 404, without having the light source 401 integrated in the assembly. For example, the light source 401 (illustrated in FIG. 4A) can be remote and detached from the other components. The light source may be driven by a power source that is separate and/or detached from the photon battery assembly that it charges. Such remote light source can be configured to provide optical energy to the assembly to achieve wireless charging of the assembly. Regardless of where the light source 401 is disposed with respect to the assembly and/or the waveguide, the light source may be in optical communication with the waveguide and/or the phosphorescent material to provide optical energy for excitation of the phosphorescent material. The remote light source can be configured to provide optical energy at a higher energy level than the optical energy emitted by the phosphorescent material. For example, where the phosphorescent material is strontium aluminate, the remote light source may provide optical energy at wavelengths that is shorter than the emission wavelength of about 520 nanometers. For example, the remote light source may provide waves at wavelengths between about 300 nanometers to about 470 nanometers. The remote light source may provide such optical energy via LED, lasers, or other optical beams, as described elsewhere herein. In some instances, a photon battery assembly configuration may maximize (or otherwise) increase the exposed surface area of one or more waveguides and/or the phosphorescent material to facilitate such wireless charging. Beneficially, the compactness and the transportability of the photon battery assemblies described herein may be greatly increased by allowing for wireless charging. Further, such wireless charging may allow for fast charging, optical charging, and on-demand charging, as well as benefit from the general widespread availability of charging sources (e.g., availability of light sources). Any of the photon battery assemblies may be configured for wireless charging, either in addition to wired (e.g., integrated) light source charging, or alternative to integrated light source charging.

Figure 4B:
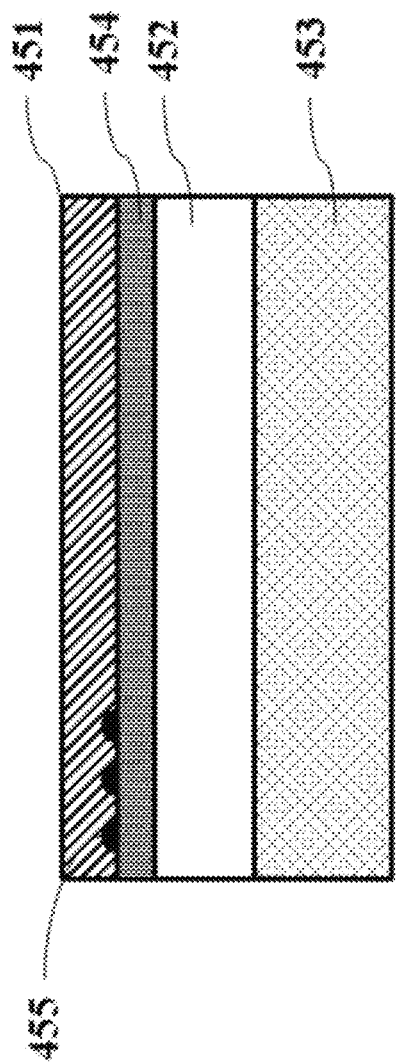
FIG. 4B illustrates a photon battery assembly with a coating comprising an optical filter.

In some instances, the waveguide may be coated at one or more surfaces. Otherwise, the waveguide may be adjacent to and/or in contact with another layer at one or more surfaces. For example, the waveguide may be coated at one or more surfaces that interfaces the phosphorescent material 402. An example coating configuration is shown in FIG. 4B. A photon battery assembly can comprise a light source (not shown), a phosphorescent material 452, a photovoltaic cell 453, and a waveguide 451, which has a coating 454 on one or more of its surfaces that interfaces the phosphorescent material. The waveguide may be adjacent to the light source and the phosphorescent material, as described elsewhere herein.

The coating 454 may be disposed between the waveguide 451 and the phosphorescent material 452. In some instances, all surfaces of the waveguide interfacing (or in optical communication with) the phosphorescent material may be covered by the coating. In other instances, a portion of the surfaces interfacing (or in optical communication with) the phosphorescent material may be covered by the coating and a portion of the surfaces interfacing (or in optical communication with) the phosphorescent material may not be covered by the coating. For example, such surfaces may be uncovered by anything and in direct optical communication with the phosphorescent material, or be covered by another coating or another layer (e.g., glass, another waveguide, etc.) and be in optical communication with the phosphorescent material through the other coating or other layer. In some instances, the other layer can be a light guide or another layer of optical elements (e.g., lens, reflector, diffusor, beam splitter, etc.). In some instances, there may be a plurality of layers between the waveguide 451 and the phosphorescent material 452, including the coating 454. For example, the plurality of layers may include an air gap or other fluid gap, a solid layer (e.g., glass, plastic.), other optical elements (e.g., lens, reflector, diffusor, beam splitter, etc.), and/or any other layer, in any combination, and arranged in any order or sequence. Regardless of coating or waveguide configuration, the phosphorescent material 452 and the waveguide 451 may be in optical communication.

The waveguide 404 may or may not be contacting the coating 454. The waveguide and the coating can be coupled or fastened together at the interface, such as via a fastening mechanism. In some instances, a support carrying the coating and/or a support carrying the waveguide may be coupled or fastened together at the interface. Examples of fastening mechanisms may include, but are not limited to, form-fitting pairs, hooks and loops, latches, staples, clips, clamps, prongs, rings, brads, rubber bands, rivets, grommets, pins, ties, snaps, velcro, adhesives, tapes, a combination thereof, or any other types of fastening mechanisms. In some instances, the coating may have adhesive and/or cohesive properties and adhere to the waveguide without an independent fastening mechanism. In some instances, the waveguide may have adhesive and/or cohesive properties and adhere to the coating without an independent fastening mechanism. For example, the coating may be painted or coated on a surface of the waveguide. The waveguide and the coating can be permanently or detachably fastened together. For example, the waveguide and the coating can be disassembled from and reassembled into the photon battery assembly without damage (or with minimal damage) to waveguide and/or the coating. Alternatively, while in contact, the waveguide and the coating may not be fastened together.

The coating 454 may be a dichroic coating or comprise other optical filter(s). For example, the coating may be configured to allow waves at certain first wavelength(s) (e.g., longer wavelength) in to excite the phosphorescent material 452, but reflect the waves at certain second wavelength(s) (e.g., shorter wavelength). For example, waves with longer wavelength(s) may be allowed to reach the phosphorescent material through the coating, and waves with shorter wavelengths(s) emitted by the phosphorescent material may be reflected by the coating and kept within the phosphorescent material layer to (i) increase the likelihood that such waves with shorter wavelengths are incident upon the photovoltaic cell 453, and (ii) prevent such waves from entering the waveguide 451 and generating undesired heat.

The coating 454 may have any thickness. For example, the coating may be between 0.5 micrometers and 5 micrometers. In some instances, the coating may be at least about 0.5, 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, 4.0, 4.1, 4.2, 4.3, 4.4, 4.5, 4.6, 4.7, 4.8, 4.9, 5.0 micrometers or more in thickness. Alternatively or in addition, the coating may be at most about 5.0, 4.9, 4.8, 4.7, 4.6, 4.5, 4.4, 4.3, 4.2, 4.1, 4.0, 3.9, 3.8, 3.7, 3.6, 3.5, 3.4, 3.3, 3.2, 3.1, 3.0, 2.9, 2.8, 2.7, 2.6, 2.5, 2.4, 2.3, 2.2, 2.1, 2.0, 1.9, 1.8, 1.7, 1.6, 1.5, 1.4, 1.3, 1.2, 1.1, 1.0, 0.9, 0.8, 0.7, 0.6, 0.5 micrometers or less in thickness.

Alternatively or in addition to the coating 454, the waveguide 451 may comprise a surface feature 455 (or multiple features) to facilitate the direction of waves towards a certain direction, and/or increase the uniformity of the direction in which waves are directed. For example, one or more surfaces of the waveguide may comprise physical structures or features, such as grooves, troughs, indentations, hills, pillars, walls, and/or other structures or features. In an example, a bottom surface of the waveguide may comprise one or more grooves formed inwards the waveguide such that waves from the light source are uniformly reflected in a direction towards the phosphorescent material to excite the phosphorescent material. Such grooves (and/or other physical structures or features) may be patterned into the waveguide. The patterns may be regular or irregular. For example, the grooves may be spaced at regular intervals or irregularly spaced. In some instances, such grooves (and/or other physical structures or features) may be discrete features. The physical structure or feature may be formed by any mechanism, such as mechanical machining. In some instances, diamond turning can be used to etch or cut the physical structures or features (e.g., grooves) into the waveguide. In some instances, one or more physical features may be integral to the waveguide. In some instances, one or more physical features may be external to, and/or otherwise coupled/attached to the waveguide by any fastening mechanism described elsewhere herein. Alternatively or in addition to the coating 454 and/or the surface feature 455, the waveguide 451 may further comprise surface marking to facilitate the direction of waves towards a certain direction.

For example, one or more surfaces of the waveguide may comprise painted markings having certain optical properties that facilitating the scattering of waves in a certain direction. For example, such painted markings may be white painted dots that facilitate scatter of light towards the phosphorescent material to excite the phosphorescent material. The waveguide may comprise any number of such painted dots (or other surface markings). The waveguide may comprise any type of painted markings, including other colored dots. The markings may form a pattern. The patterns may be regular or irregular. For example, the dots may be spaced at regular intervals or irregularly spaced. In some instances, such dots may be discrete markings.

Figure 5:
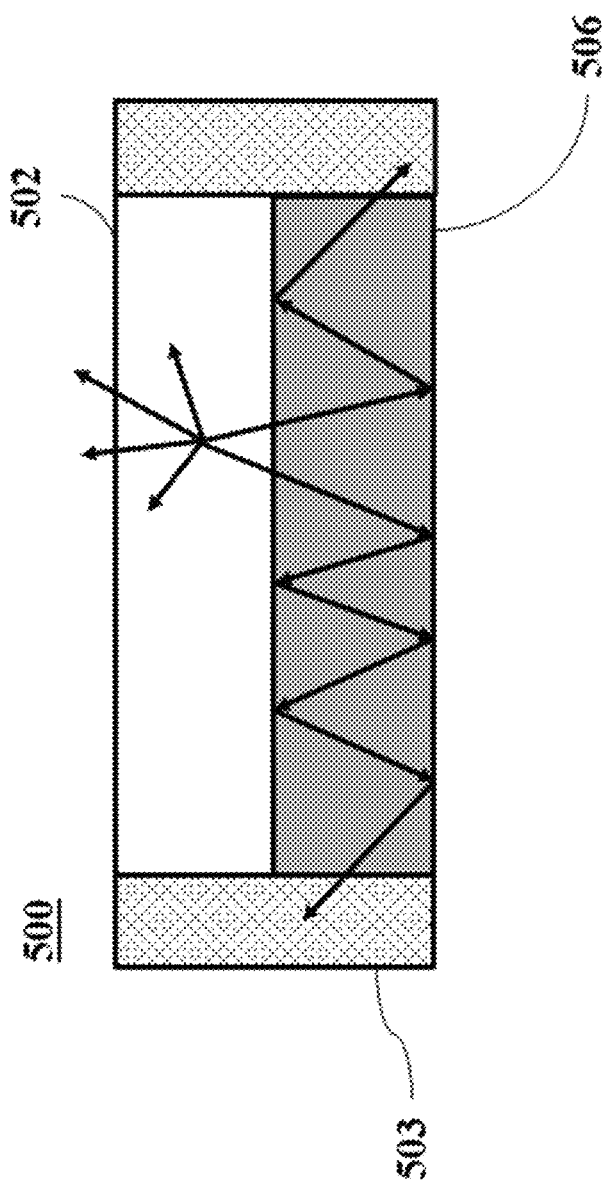
FIG. 5 illustrates another photon battery assembly with a waveguide.

Any of the photon battery assemblies described herein may comprise a waveguide in optical communication with an optical filter, such as the dichroic coating described with respect to FIG. 4B, or comprise a waveguide comprising the physical features and/or markings described with respect to FIG. 4B. For example, the photon battery assembly 100 of FIG. 1 may comprise a waveguide (not shown) in optical communication with a coating disposed between the waveguide and the phosphorescent material 102. For example, the photon battery assembly 400 of FIG. 4A may comprise a coating disposed between the waveguide 404 and the phosphorescent material 402. 661 FIG. 5 illustrates another photon battery assembly with a waveguide. A photon battery assembly 500 can comprise a light source (not shown), a phosphorescent material 502, a photovoltaic cell 503, and a waveguide 506. The waveguide may be adjacent to the photovoltaic cell and the phosphorescent material. For example, the waveguide may be sandwiched by the photovoltaic cell and the phosphorescent material. In other examples, as shown in FIG. 5, some surfaces of the waveguide may be adjacent to the phosphorescent material and some surfaces of the waveguide may be adjacent to the photovoltaic cell. In some instances, additionally, the waveguide may be adjacent to the light source. The configuration of the photon battery assembly with the waveguide is not limited to FIG. 5.

Regardless of contact between the phosphorescent material 502 and waveguide 506, the phosphorescent material and the waveguide may be in optical communication. Regardless of contact between the photovoltaic cell 503 and waveguide, the photovoltaic cell and the waveguide may be in optical communication. In some instances, regardless of contact between the light source and waveguide, the light source and the waveguide may be in optical communication.

The waveguide 506 may or may not be contacting the photovoltaic cell 503. If the waveguide and the photovoltaic cell are in contact, the waveguide can interface a light-absorbing surface of the photovoltaic cell. The waveguide and the photovoltaic cell can be coupled or fastened together at the interface, such as via a fastening mechanism. In some instances, a support carrying the photovoltaic cell and/or a support carrying the waveguide may be coupled or fastened together at the interface. Examples of fastening mechanisms may include, but are not limited to, form-fitting pairs, hooks and loops, latches, staples, clips, clamps, prongs, rings, brads, rubber bands, rivets, grommets, pins, ties, snaps, velcro, adhesives, tapes, a combination thereof, or any other types of fastening mechanisms. In some instances, the waveguide may have adhesive and/or cohesive properties and adhere to the photovoltaic cell without an independent fastening mechanism. The waveguide and the photovoltaic cell can be permanently or detachably fastened together. For example, the waveguide and the photovoltaic cell can be disassembled from and reassembled into the photon battery assembly 500 without damage (or with minimal damage) to waveguide and/or the photovoltaic cell. Alternatively, while in contact, the waveguide and the photovoltaic cell may not be fastened together.

If the waveguide 506 and the photovoltaic cell 503 are not in contact, the waveguide can otherwise be in optical communication with a light-emitting surface of the photovoltaic cell. For example, the photovoltaic cell can be positioned in an optical path of light emitted by a light-emitting surface of the waveguide. In some instances, there can be an air gap between the waveguide and the photovoltaic cell. In some instances, there can be another intermediary layer, such as another waveguide, between the waveguide and the photovoltaic cell. The intermediary layer can be air or other fluid. The intermediary layer can be a light guide or another layer of optical elements (e.g., lens, reflector, diffusor, beam splitter, etc.). In some instances, there can be a plurality of intermediary layers between the waveguide and the photovoltaic cell.

The waveguide 506 may or may not be contacting the phosphorescent material 502. If the waveguide and the phosphorescent material are in contact, the waveguide can interface a light-emitting surface of the phosphorescent material. The waveguide and the phosphorescent material can be coupled or fastened together at the interface, such as via a fastening mechanism. In some instances, a support carrying the phosphorescent material and/or a support carrying the waveguide may be coupled or fastened together at the interface. Examples of fastening mechanisms may include, but are not limited to, form-fitting pairs, hooks and loops, latches, staples, clips, clamps, prongs, rings, brads, rubber bands, rivets, grommets, pins, ties, snaps, velcro, adhesives, tapes, a combination thereof, or any other types of fastening mechanisms. In some instances, the waveguide may have adhesive and/or cohesive properties and adhere to the phosphorescent material without an independent fastening mechanism. In some instances, the phosphorescent material may have adhesive and/or cohesive properties and adhere to the waveguide without an independent fastening mechanism. For example, the phosphorescent material may be painted or coated on the waveguide. The waveguide and the phosphorescent material can be permanently or detachably fastened together. For example, the waveguide and the phosphorescent material can be disassembled from and reassembled into the photon battery assembly 500 without damage (or with minimal damage) to waveguide and/or the phosphorescent material. Alternatively, while in contact, the waveguide and the phosphorescent material may not be fastened together.

If the waveguide 506 and the phosphorescent material 502 are not in contact, the waveguide can otherwise be in optical communication with a light-emitting surface of the phosphorescent material. In some instances, there can be another intermediary layer, such as another waveguide, between the waveguide and the phosphorescent material. The intermediary layer can be air or other fluid. The intermediary layer can be a light guide or another layer of optical elements (e.g., lens, reflector, diffusor, beam splitter, etc.). In some instances, there can be a plurality of intermediary layers between the waveguide and the phosphorescent material.

The waveguide 506 may be configured to direct waves at a second wavelength emitted from the phosphorescent material 502 to the photovoltaic cell 503. Beneficially, the waveguide may deliver optical energy from the phosphorescent material to the photovoltaic cell with great efficiency and minimal loss of optical energy (or other forms of energy). The phosphorescent material may emit optical energy at the second wavelength without directional specificity, such as in isotropic emission. The waveguide may provide optical communication between the photovoltaic cell and distributed volumes of the phosphorescent material where otherwise some volumes of phosphorescent material would not be in optical communication with the photovoltaic cell, allowing for flexible arrangements of the photovoltaic cell relative to the phosphorescent material. For example, without waveguides, the optical energy at the second wavelength emitted from the phosphorescent material may be absorbed most efficiently by the immediately adjacent light absorbing surface of the photovoltaic cell, if it reaches the photovoltaic cell at all. The optical energy that is emitted away from the light absorbing surface of the photovoltaic cell may be lost in the process. While large surface area interface between the phosphorescent material and the photovoltaic cell may facilitate efficient optical energy delivery from the phosphorescent material to the photovoltaic cell, this may be impractical and expensive when constructing compact energy storage systems. By implementing waveguides to facilitate optical communication between the photovoltaic cell and the phosphorescent material, the photovoltaic cell may efficiently absorb the optical energy from the phosphorescent material even if they are not immediately adjacent.

The waveguide 506 may have a maximum dimension (e.g., width, length, height, radius, diameter, etc.) of at least about 1 millimeter (mm), 2 mm, 3 mm, 4 mm, 5 mm, 6 mm, 7 mm, 8 mm, 9 mm, 1 centimeter (cm), 2 cm, 3 cm, 4 cm, 5 cm, 10 cm, 15 cm, 20 cm, 30 cm, 40 cm, 50 cm or more. Alternatively or in addition, the waveguide may have a maximum dimension of at most about 50 cm, 40 cm, 30 cm, 20 cm, 15 cm, 10 cm, 5 cm, 4 cm, 3 cm, 2 cm, 1 cm, 9 mm, 8 mm, 7 mm, 6 mm, 5 mm, 4 mm, 3 mm, 2 mm, 1 mm or less. The waveguide may be square, rectangular (e.g., having an aspect ratio for length to width of about 1:1.1, 1:1.2, 1:1.3, 1:1.4, 1:1.5, 1:1.6, 1:1.7, 1:1.8, 1:1.9, 1:2, 1:3, 1:4, 1:5, 1:10, etc.), or any other shape. The waveguide may comprise material such as plastic or glass. The waveguide may comprise material used in an injection mold.

For example, in FIG. 5, the optical energy emitted from the phosphorescent material 502 is directed through the layer of waveguide 506 to reach the photovoltaic cell 503. As described elsewhere herein, the phosphorescent material 502 may have absorbed optical energy at the first wavelength from a light source (not shown), such as in the configuration illustrated in FIG. 4A. The waveguide 506 may have a refractive index such as to allow for total internal reflection of the optical wave at the second wavelength within the waveguide 506 until such optical energy is transmitted to the photovoltaic cell 503. The waveguide may have a lower refractive index than any adjacent layer to the waveguide. In some instances, the waveguide may be adjacent to the phosphorescent material from a first surface, and adjacent to the photovoltaic cell from a second surface, wherein the first surface and the second surface are substantially orthogonal. In some instances, the waveguide may be adjacent to a plurality of layers of phosphorescent material (e.g., interfacing different surfaces of the waveguide), and configured to direct waves received from the plurality of layers of phosphorescent material to the photovoltaic cell.

Figure 6:
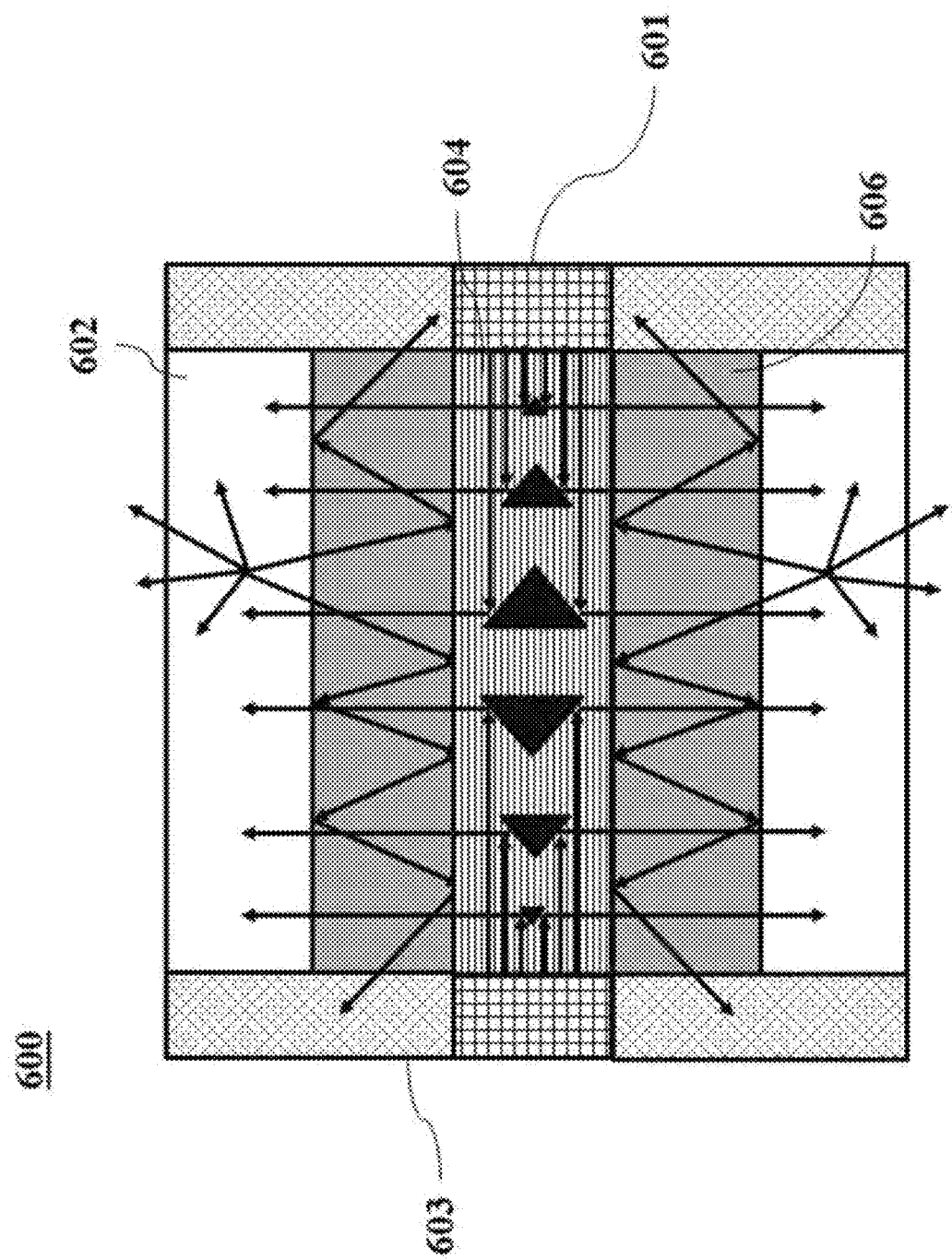
FIG. 6 illustrates another photon battery assembly with waveguides.

FIG. 6 illustrates another photon battery assembly with waveguides. A photon battery assembly 600 can comprise a light source 601, a phosphorescent material 602, a photovoltaic cell 603, a first waveguide 604, and a second waveguide 606. In some instances, the first waveguide 604 may correspond to the waveguide 404 described with respect to FIG. 4. In some instances, the second waveguide 606 may correspond to the waveguide 506 described with respect to FIG. 5.

The photon battery assembly 600 may be constructed such that the first waveguide 604 is adjacent to the second waveguide 606, and the second waveguide is adjacent to the phosphorescent material 602. The first waveguide and the phosphorescent material may each be adjacent to two surfaces of the second waveguide that are substantially parallel. The first waveguide may be adjacent to the light source 601. The light source and the second waveguide may be adjacent to two surfaces of the first waveguide that are substantially orthogonal. The second waveguide may be adjacent to the photovoltaic cell 603. The photovoltaic cell and the phosphorescent material may be adjacent to two surface of the second waveguide that are substantially orthogonal. In some instances, the photovoltaic cell and the light source may be substantially parallel and/or coplanar. The configuration of the photon battery assembly with waveguides is not limited to FIG. 6.

In operation, the photon battery may be charged via the first waveguide 604 which guides optical energy emitted by the light source 601 at the first wavelength to the phosphorescent material 602. The optical energy received from the light source may be substantially orthogonally reflected (e.g., via a reflective surface) within the first waveguide to pass through the second waveguide 606 (with minimal energy loss) for even absorption across the phosphorescent material and subsequent excitation. After a time delay, as described elsewhere herein, the phosphorescent material may emit optical energy at a second wavelength. Such emission may be isotropic (e.g., non-direction specific). The emitted optical energy may be directed by the second waveguide, such as via total internal reflection, to the photovoltaic cell for absorption by the photovoltaic cell. Alternatively or in addition, the emitted optical energy may be directed to the photovoltaic cell directly. In some instances, the second waveguide may have a refractive index that is lower than that of the first waveguide and that of the phosphorescent material to allow for total internal reflection. As illustrated in FIG. 6, the photon battery may be stacked in a similar configuration.

Figure 7:
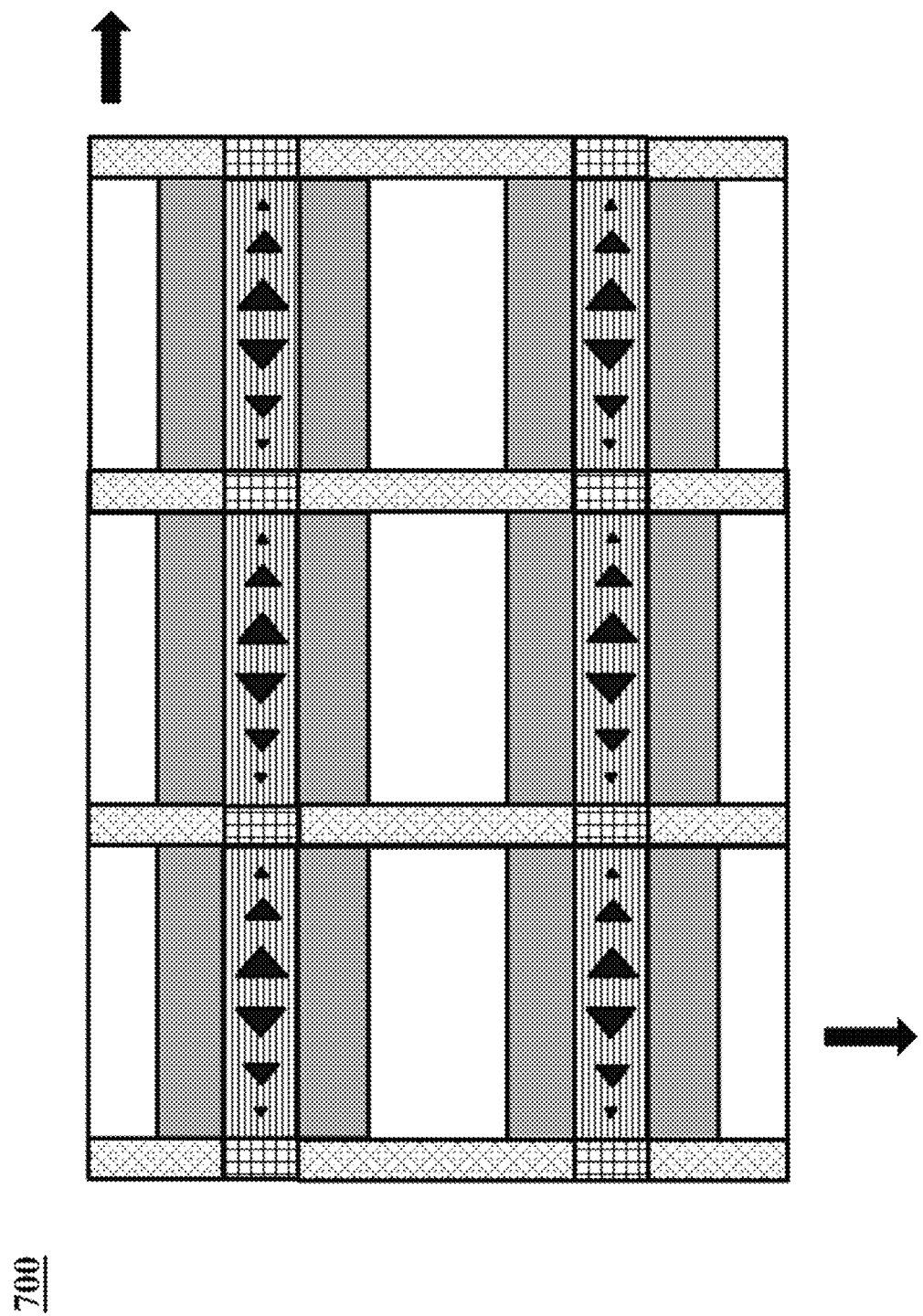
FIG. 7 shows a stack of a plurality of photon battery assemblies.

FIG. 7 shows a stack of a plurality of photon battery assemblies. A photon battery assembly can be connected to achieve different desired voltages, energy storage capacities, power densities, and/or other battery properties. For example, an energy storage system 700 may comprise a stack of a first photon battery assembly, a second photon battery assembly, a third photon battery assembly, a fourth photon battery assembly, and so on, which are stacked vertically or horizontally. Each photon battery assembly may comprise (or share) a light source, phosphorescent material, photovoltaic cell, first waveguide, and second waveguide, as described elsewhere herein. While FIG. 7 shows six photon battery assemblies stacked together, any number of photon battery assemblies can be stacked together in any configuration. For example, at least 2, 3, 4, 5, 6, 7, 8, 9, 10, 15, 20, 25, 30, 35, 40, 45, 50, 100, 200, or more photon battery assemblies can be stacked together. While FIG. 7 shows a linear grid-like stack in the horizontal and vertical directions, the assemblies can be stacked in different configurations, such as in concentric (or circular) stacks.

Figure 8:
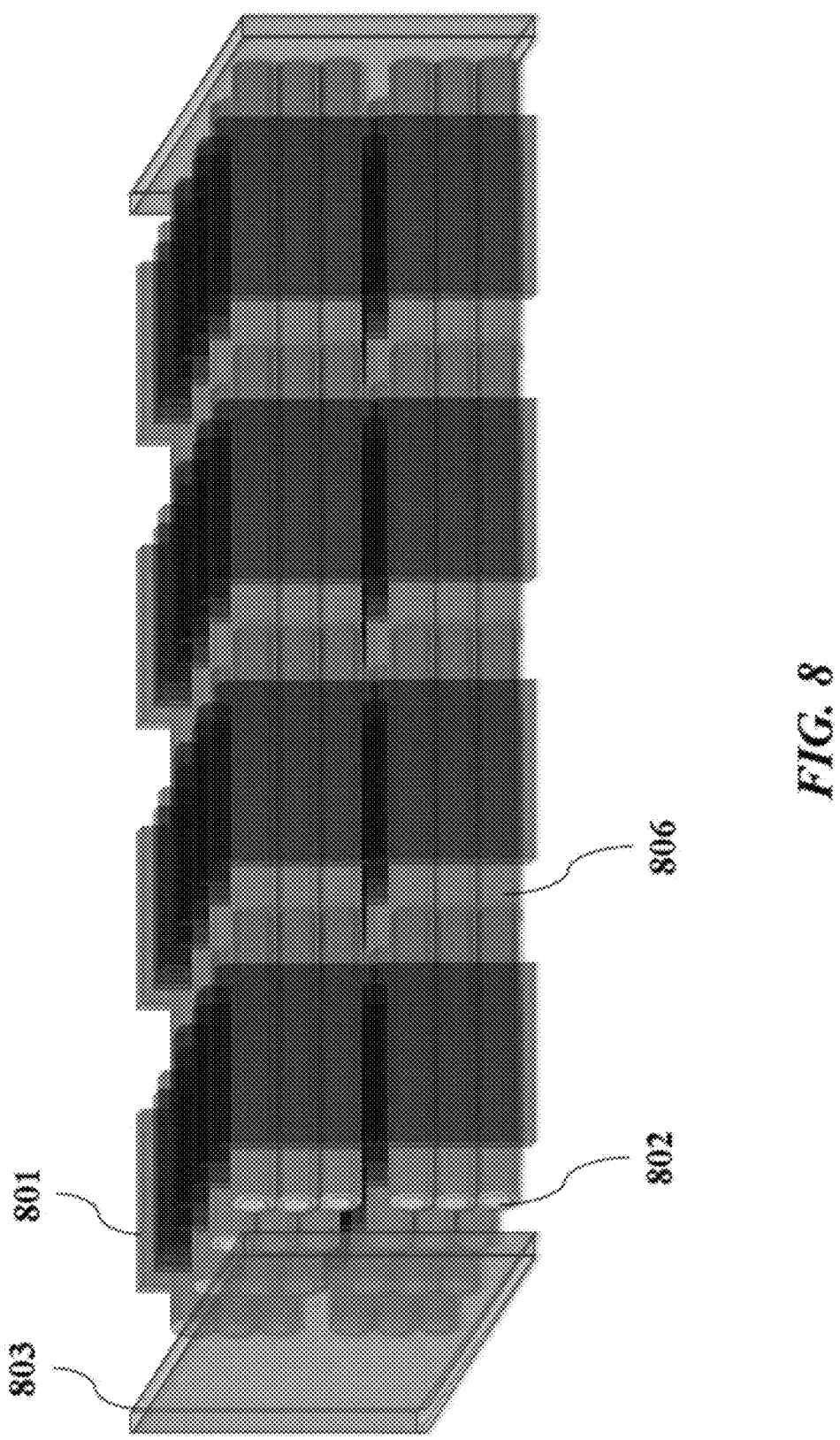
FIG. 8 shows an exploded view of another configuration for a photon battery assembly stack with hollow core waveguides.

FIG. 8 shows an exploded view of another configuration for a photon battery assembly stack with hollow core waveguides. A waveguide 806 may comprise a hollow core. For example, the waveguide may be an optical fiber or cable with a hollow core. Alternatively, the waveguide may have a cavity or trench with an opening. The waveguide may have a plurality of cavities or trenches with a plurality of openings. The hollow core (or cavity or trench) may be filled by phosphorescent material 802 such as to form filled cylindrical units. Alternatively, the hollow core may be any shape (e.g., rectangular, triangular, hexagonal, non-polygonal, etc.). The cylindrical units may be linearly stacked, such as in groups of 2, 3, 4, 5, 6, 7, 8, 9, 10, 20, 30, 40, 50, 100, 200, or more units. The groups of linearly stacked cylindrical units may be sandwiched on opposing sides by light source panels 801. In some instances, a single light source panel may stretch along a length of a cylindrical unit. Alternatively, as shown in FIG. 8, a plurality of light source panels may be intermittently placed along the length of the single cylindrical unit. In some instances, groups of linearly stacked cylindrical units and the sandwiching light source panels may be stacked in alternating layers. Although this example shows four groups of six linearly stacked cylindrical units alternating with five light source panels for each unit length of cylindrical unit, the stack may be in any configuration (e.g., 25 groups of 7 linearly stacked cylindrical units alternating with 26 light source panels). A photovoltaic cell 803 may be adjacent to the end of the cylindrical units, substantially orthogonal to the lengths of the cylindrical units, and substantially orthogonal to the light source panels. The photon battery assembly may resemble a cuboid shape, as illustrated in FIG. 8. The photon battery assembly is not limited to the configuration illustrated in FIGS. 8.

Figure 9:
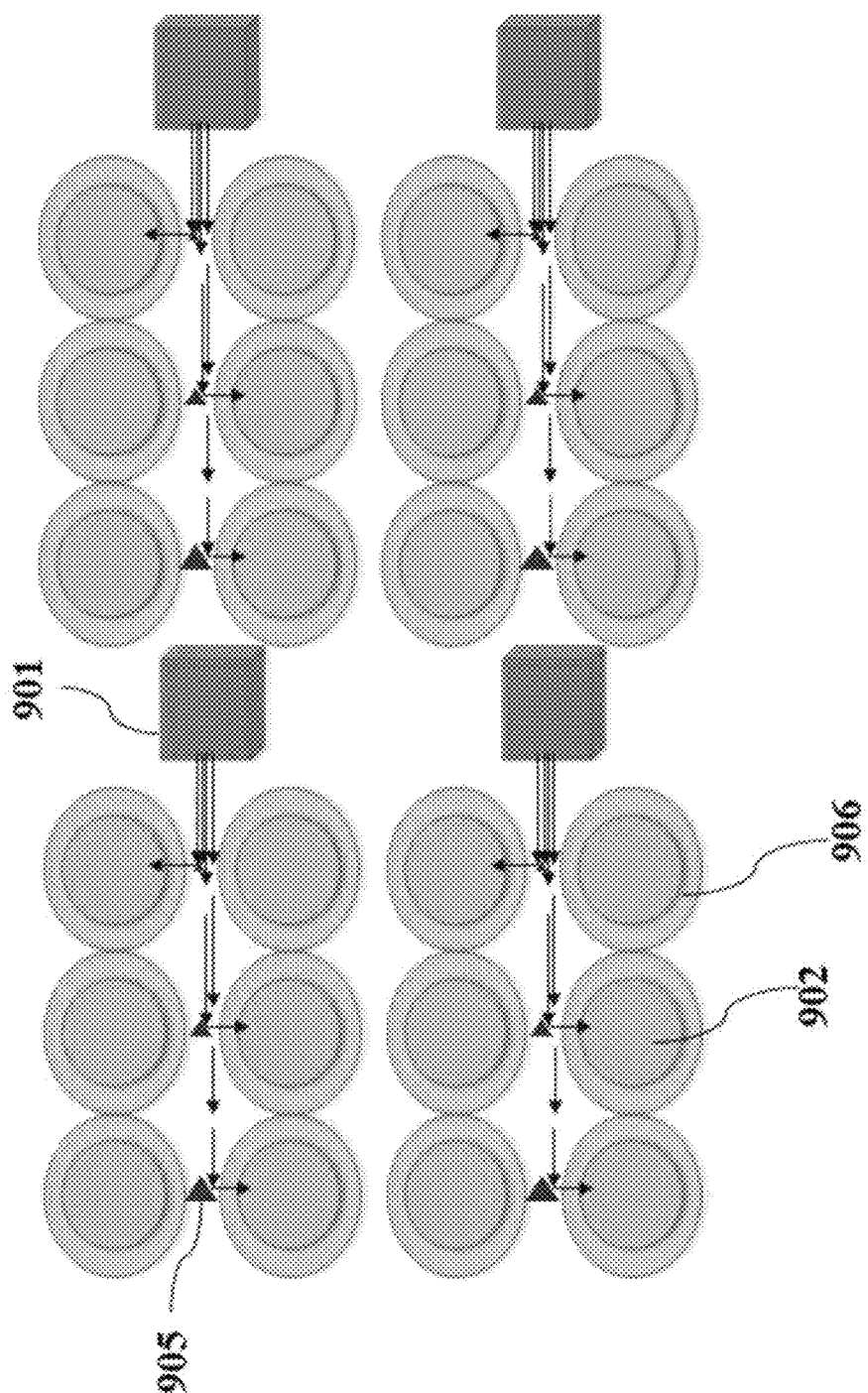
FIG. 9 illustrates a partial cross-sectional side view of the photon battery assembly stack of FIG. 8.

In some instances, the light source panel 801 may comprise a light source (e.g., LED) and a waveguide. The waveguide may correspond to the waveguide 404 described with respect to FIG. 4 and configured to direct optical energy from the light source to different cylindrical units. FIG. 9 illustrates a partial cross-sectional side view of the photon battery assembly stack of FIG. 8. The optical energy emitted by a light source 901 is directed by one or more reflective surfaces 905 in a first waveguide (e.g., in the light source panel 801) to the phosphorescent material 902 in different cylindrical units. The optical energy may pass through a second waveguide 906 (configured to direct optical energy emitted from the phosphorescent material to the photovoltaic cell (not shown)). The first waveguide may comprise increasingly larger reflective surfaces (e.g., 905) in the direction of the optical path of the optical energy emitted by the light source 901 such as to evenly distribute the optical energy to the different cylindrical units (e.g., in the linear stack).

Each photon battery assembly can be configured as described in FIGS. 1-9. Alternatively, different components of the photon battery assembly (e.g., light source, phosphorescent material, photovoltaic cell, first waveguide, second waveguide, coating, etc.) can be stacked in different configurations (e.g., orders). A plurality of photon battery assemblies can be electrically connected in series, in parallel, or a combination thereof. In some instances, there may be interconnects and/or other electrical components between each photon battery assembly. In some instances, a controller can be electrically coupled to one or more photon battery assemblies and be capable of managing the inflow and/or outflow of power from each or a combination of the battery assemblies.

In some embodiments, alternative to or in addition to the optical energy, the phosphorescent material may absorb kinetic energy, and after a time delay, emit optical energy converted from the kinetic energy to be absorbed by the photovoltaic cell. For example, radioactive material can excite the phosphorescent material with high energy particles (having high kinetic energy).

Figure 17:
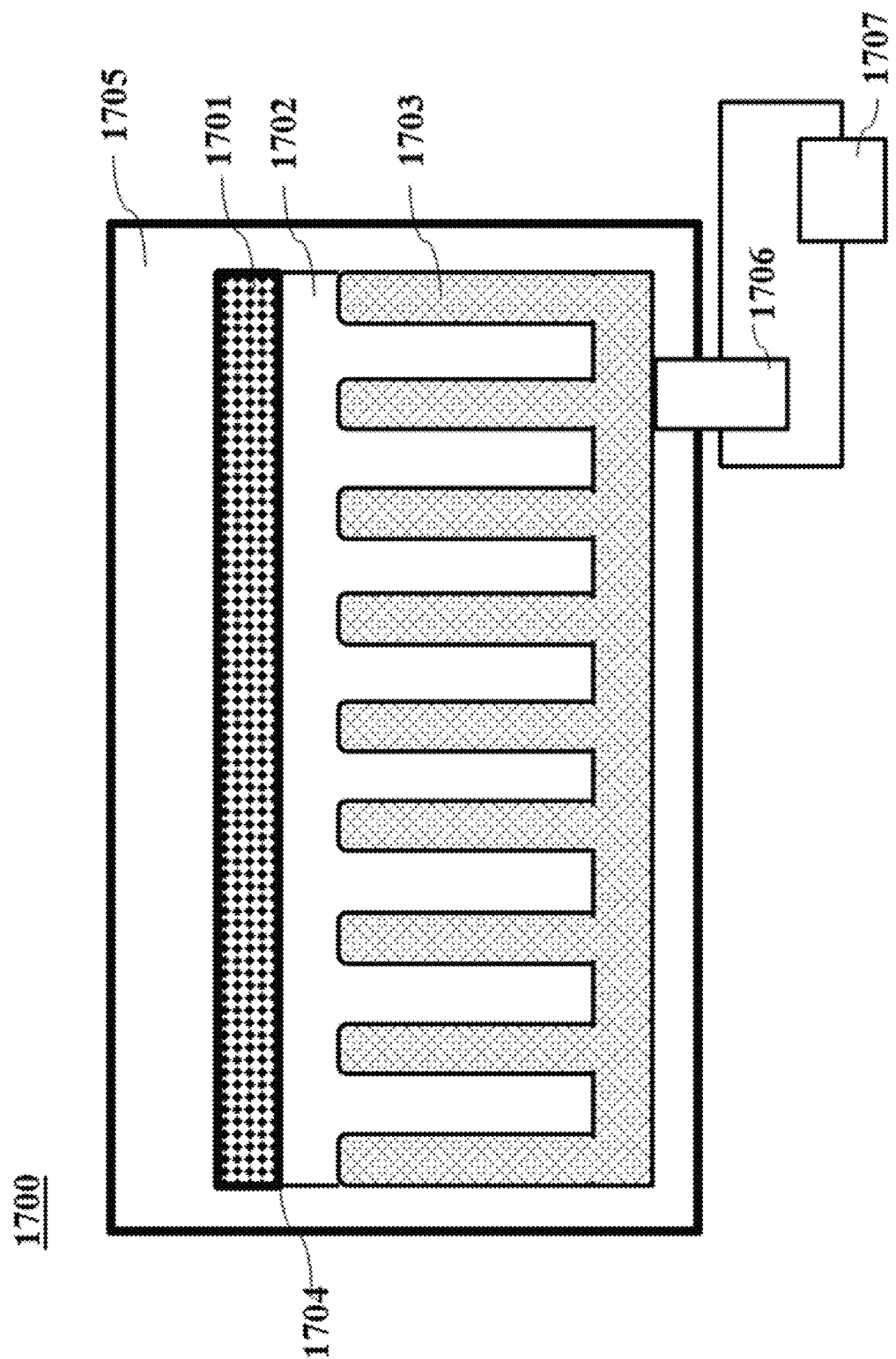
FIG. 17 shows a photon battery assembly comprising radioactive material.

FIG. 17 shows a photon battery assembly comprising radioactive material. The photon battery assembly 1700 can comprise radioactive material 1701, phosphorescent material 1702, and photovoltaic cells 1703. In some instances, the radioactive material 1701 can substitute the light source in previous embodiments of the photon battery assembly (e.g., light source in FIGS. 1-3 and FIGS. 12-16). In some instances, the radioactive material 1701 can be in addition to the light source in previous embodiments (light source not shown in FIG. 17).

As described elsewhere herein, the phosphorescent material 1702 can be adjacent to a light-absorbing surface of the photovoltaic cell 1703. In some instances, as described elsewhere herein (and as shown in FIG. 17), the phosphorescent material may interface with a light-absorbing surface of the photovoltaic cell 1703 that defines one or more depressions and/or corresponding protrusions. In other instances, the phosphorescent material may interface with a light-absorbing surface of the photovoltaic cell that has any other shape, form, or structure, such as a planar structure (e.g., as in the photovoltaic cell 103 shown in FIG. 1). The phosphorescent material may further be adjacent to the radioactive material 1701. For example, the phosphorescent material can be adjacent to a high energy particle emitting surface of the radioactive material. In some instances, the radioactive material may be shielded from the rest of the photon battery assembly (e.g., phosphorescent material, photovoltaic cell, etc.) in a shell, casing, membrane, or other compartment 1704. The compartment 1704 may allow high energy particles (or otherwise kinetic energy) to permeate or pass through the compartment to contact the phosphorescent material. In some instances, relatively heavy elements such as lead can be used to reflect radioactive emission (e.g., high energy particles) towards the phosphorescent material.

While FIG. 17 shows the radioactive material 1701 positioned above both the phosphorescent material 1702 and the photovoltaic cell 1703, the configuration of the photon battery assembly 1700 is not limited to such. For example, the radioactive material may be positioned in the middle, the bottom, and/or in a location between the trench-like configurations of the photovoltaic cell. In another example, the radioactive material may be positioned between at least a portion of the photovoltaic cell and the phosphorescent material. In another example, the radioactive material may be in one or more different compartments and placed in different locations relative to the photovoltaic cell and/or the phosphorescent material. The radioactive material may be positioned in a location where high energy particles emitted by the radioactive material is capable of reaching and/or travelling through the phosphorescent material.

The radioactive material 1701 can emit high energy particles, such as products of radioactive decay. Radioactive decay can include alpha decay, beta decay, gamma decay, and/or spontaneous fission. The high energy particles can be alpha particles (e.g., nucleons), beta decay products (e.g., electrons, positrons, neutrino, etc.), gamma rays, and/or a combination thereof. The high energy particles can have high kinetic energy. The high energy particles can travel through the phosphorescent material 1702 upon emission from the radioactive material and excite the phosphorescent material (e.g., absorb the kinetic energy of the high energy particles). The phosphorescent material can subsequently, after a time delay, emit optical energy, such as at a visible wavelength (e.g., 400-700 nm). In some instances, the rate of absorption of kinetic energy by the phosphorescent material can be faster than the rate of emission of optical energy by the phosphorescent material. The phosphorescent material can emit optical energy at other wavelengths or ranges of wavelengths in the electromagnetic spectrum. As described elsewhere herein, the photovoltaic cell 1703 can absorb such optical energy emitted by the phosphorescent material and generate electrical power. The electrical power generated by the photovoltaic cell can be discharged to an electrical load 1707, such as through a port 1706 of the photovoltaic cell. In some instances, the photon battery assembly 1700 can comprise an outer casing, shell or compartment 1705 to house the radioactive material 1701, phosphorescent material 1702, and the photovoltaic cells 1703, such as to contain any radiation that can escape the energy storage system during normal use. The compartment 1705 can be configured to contain any radiation emitted by the radioactive material 1701 from escaping the compartment 1705. For example, the port 1706 of the photovoltaic cell may be the only connection from outside the compartment 1705 to inside the compartment 1705.

For example, the radioactive material 1701 can be strontium-90. Other examples of radioactive material can include, but are not limited to, tritium, beryllium-10, carbon-14, fluorine-18, aluminium-26, chlorine-36, potassium-40, calcium-41, cobalt-60, technetium-99, technetium-99m, iodine-129, iodine-131, xenon-135, caesium-137, gadolinium-153, bismuth-209, polonium-210, radon-222, thorium-232, uranium-235, plutonium-238, plutonium-239, americium-241, and californium-252.

Figure 18:
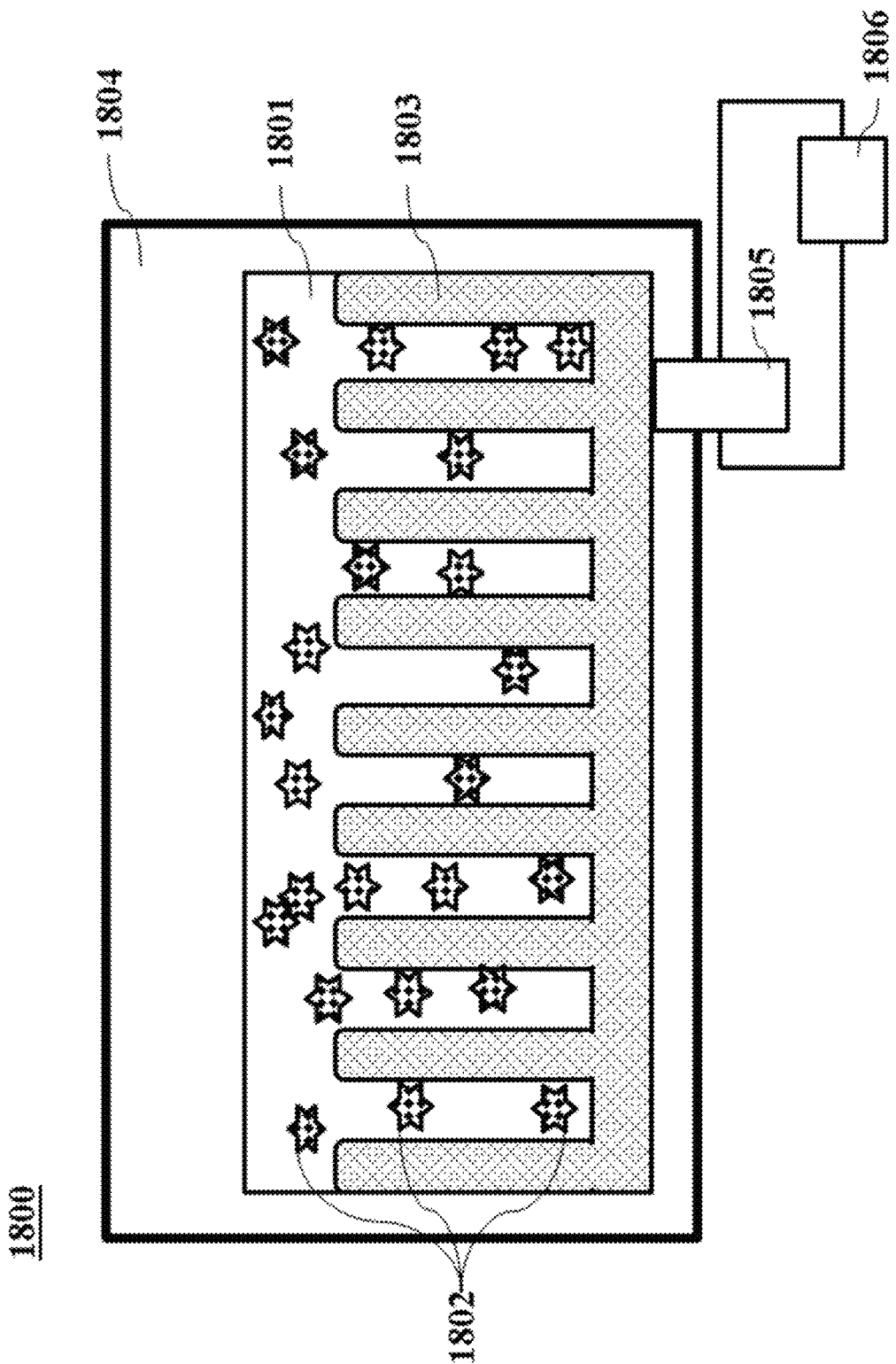
FIG. 18 shows a photon battery assembly comprising radioactive material in the phosphorescent material.

FIG. 18 shows a photon battery assembly comprising radioactive material in the phosphorescent material. In some instances, a photon battery assembly 1800 may comprise a phosphorescent material 1801 that comprises a radioactive material 1802. For example, instead of having a separate radioactive sample inserted into the photon battery assembly (such as in FIG. 17), the radioactive material can be integrated in the phosphorescent material. By way of example, a phosphorescent material comprising strontium aluminate doped with europium can be manufactured to have strontium-90 dispersed throughout the phosphorescent material.

The radioactive material 1802 can emit high energy particles from within the phosphorescent material 1801, such as products of radioactive decay. The high energy particles can travel through the phosphorescent material upon emission from the radioactive material and excite the phosphorescent material (e.g., absorb the kinetic energy of the high energy particles). The phosphorescent material can subsequently, after a time delay, emit optical energy. In some instances, the rate of absorption of kinetic energy by the phosphorescent material can be faster than the rate of emission of optical energy by the phosphorescent material. As described elsewhere herein, the photovoltaic cell 1803 can absorb such optical energy emitted by the phosphorescent material and generate electrical power. The electrical power generated by the photovoltaic cell can be discharged to an electrical load 1806, such as through a port 1805 of the photovoltaic cell. In some instances, the photon battery assembly 1800 can comprise an outer casing, shell or compartment 1804 to house the phosphorescent material 1801 comprising the radioactive material 1802 and the photovoltaic cells 1803, such as to contain any radiation that can escape the energy storage system during normal use. The compartment 1804 can be configured to contain any radiation emitted by the radioactive material 1802 from within the phosphorescent material 1801 from escaping the compartment 1804. For example, the port 1805 of the photovoltaic cell may be the only connection from outside the compartment 1804 to inside the compartment 1804.

In some instances, a photon battery assembly comprising radioactive material can provide higher energy storage capacity (e.g., energy density, power density, etc.) than a photon battery comprising a light source after a single charge of the same volume. In some instances, the energy storage capacity of a radioactive material comprising photon battery assembly can depend on a half-life of a radioactive material in the photon battery assembly. For example, a radioactive material can provide continuous kinetic energy to the photon battery assembly as it undergoes radioactive transformation. In some instances, a photon battery assembly comprising radioactive material can be disposed of after near full consumption of the radioactive material (e.g., emitting negligent kinetic energy). In some instances, radioactive material can be replaced after near full consumption. In some instances, the phosphorescent material and/or photovoltaic cells can be recycled (e.g., in other photon battery assemblies) after near full consumption of the radioactive material. In some instances, a photon battery assembly can comprise both radioactive material and a light source, and may be recharged via methods described elsewhere herein (e.g., providing electric power to the light source). For example, even after near full consumption of the radioactive material, the photon battery assembly may be used via recharging with electrical energy.

Figure 10:
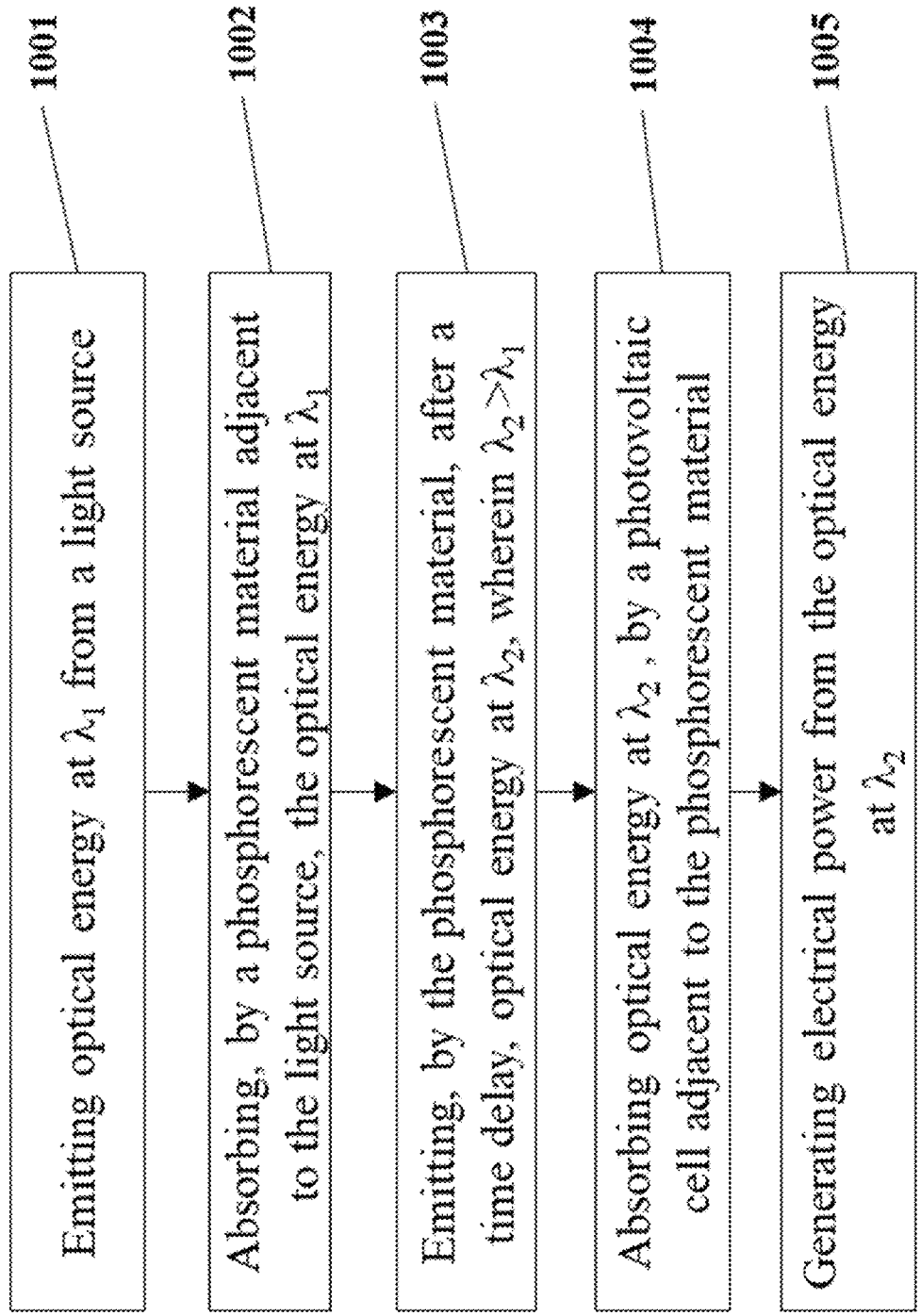
FIG. 10 illustrates a method of storing energy in a photon battery.

FIG. 10 illustrates a method of storing energy in a photon battery. The method can comprise, at a first operation 1001, emitting optical energy at a first wavelength (e.g., $\lambda_1$) from a light source. The optical energy at the first wavelength can be emitted from a light-emitting surface of the light source. The light source can be an artificial light source, such as a LED, laser, or lamp. The light source can be a natural light source. The light source can be powered by an electric power source, such as another energy storage device (e.g., battery, supercapacitors, capacitors, fuel cells, etc.) or another power supply (e.g., electrical grid).

At a second operation 1002, a phosphorescent material that is adjacent to the light source can absorb the optical energy at the first wavelength. The optical energy may be directed from the light source to the phosphorescent material via a first waveguide. For example, the phosphorescent material can be adjacent to the light-emitting surface of the light source. In some instances, the first wavelength can be an ultraviolet wavelength (e.g., 20-400 nm).

At a next operation 1003, after a time delay, the phosphorescent material can emit optical energy at a second wavelength (e.g., $\lambda_2$). In some instances, the first wavelength can be a visible wavelength (e.g., 400-700 nm). The second wavelength can be greater than the first wavelength. That is, the optical energy at the first wavelength can be at a higher energy level than the optical energy at the second wavelength. In some instances, the rate of absorption of the optical energy at the first wavelength by the phosphorescent material can be faster than the rate of emission of the optical energy at the second wavelength by the phosphorescent material.

At a next operation 1004, a photovoltaic cell adjacent to the phosphorescent material can absorb the optical energy at the second wavelength that is emitted by the phosphorescent material. The optical energy may be directed from the phosphorescent material to the photovoltaic cell via a second waveguide. For example, a light-absorbing surface of the photovoltaic cell can absorb the optical energy at the second wavelength. In some instances, the photovoltaic cell can be tailored to absorb the wavelength or range of wavelengths that is emitted by the phosphorescent material. In some instances, the light-absorbing surface of the photovoltaic cell can comprise one or more depressions defined by corresponding protrusions to allow for increased interfacial surface area between the phosphorescent material and the photovoltaic cell.

At a next operation 1005, the photovoltaic cell can convert the absorbed optical energy at the second wavelength and generate electrical power. In some instances, the electrical power generated by the photovoltaic cell can be used to power an electrical load that is electrically coupled to the photovoltaic cell. The electrical load can be an electronic device, such as a mobile phone, tablet, or computer. The electrical load can be a vehicle, such as a car, boat, airplane, or train. The electrical load can be a power grid. In some instances, at least some of the electrical power generated by the photovoltaic cell can be used to power the light source, such as when no electrical load is connected to the photovoltaic cell. In some instances, at least some of the electrical power generated by the photovoltaic cell can be used to charge a rechargeable battery (e.g., lithium ion battery), such as when no electrical load is connected to the photovoltaic cell. The rechargeable battery can in turn be used to power the light source. Beneficially, a photon battery assembly used in this method can be at least in part self-sustaining and prevent loss of energy from the system (e.g., other than from inefficient conversion of energy).

Figure 19:
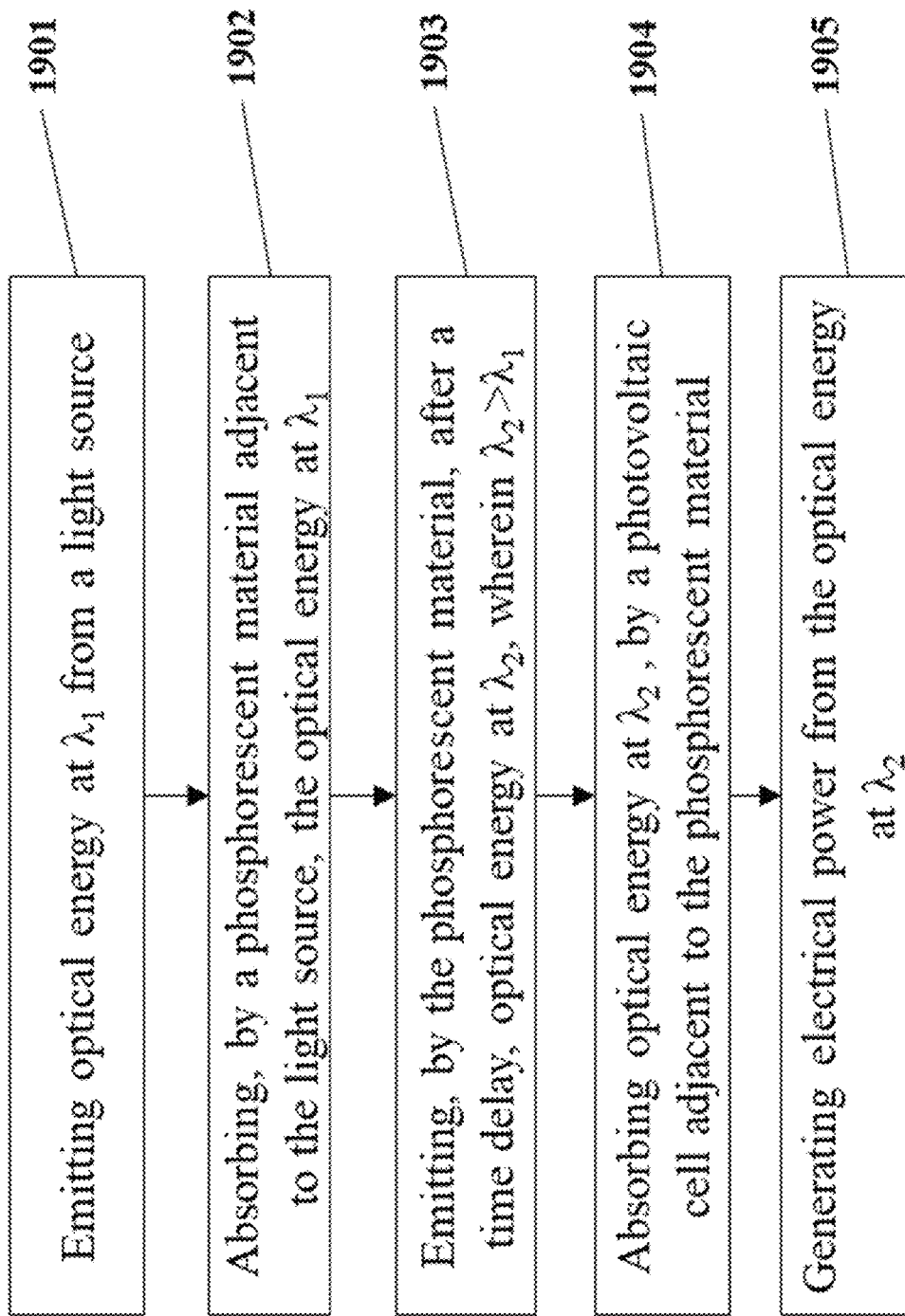
FIG. 19 illustrates a method of storing energy in a photon battery.

FIG. 19 illustrates a method of storing energy in a photon battery. The method can comprise, at a first step 1901, emitting optical energy at a first wavelength (e.g., $\lambda_1$) from a light source. The optical energy at the first wavelength can be emitted from a light-emitting surface of the light source. The light source can be an artificial light source, such as a LED, laser, or lamp. The light source can be a natural light source. The light source can be powered by an electric power source, such as another energy storage device (e.g., battery, supercapacitors, capacitors, fuel cells, etc.) or another power supply (e.g., electrical grid).

At a second step 1902, a phosphorescent material that is adjacent to the light source can absorb the optical energy at the first wavelength. For example, the phosphorescent material can be adjacent to the light-emitting surface of the light source. In some instances, the first wavelength can be an ultraviolet wavelength (e.g., 20-400 nm).

At a next step 1903, after a time delay, the phosphorescent material can emit optical energy at a second wavelength (e.g., $\lambda_2$). In some instances, the first wavelength can be a visible wavelength (e.g., 400-700 nm). The second wavelength can be greater than the first wavelength. That is, the optical energy at the first wavelength can be at a higher energy level than the optical energy at the second wavelength. In some instances, the rate of absorption of the optical energy at the first wavelength by the phosphorescent material can be faster than the rate of emission of the optical energy at the second wavelength by the phosphorescent material.

At a next step 1904, a photovoltaic cell adjacent to the phosphorescent material can absorb the optical energy at the second wavelength that is emitted by the phosphorescent material. For example, a light-absorbing surface of the photovoltaic cell can absorb the optical energy at the second wavelength. In some instances, the photovoltaic cell can be tailored to absorb the wavelength or range of wavelengths that is emitted by the phosphorescent material. In some instances, the light-absorbing surface of the photovoltaic cell can comprise one or more depressions defined by corresponding protrusions to allow for increased interfacial surface area between the phosphorescent material and the photovoltaic cell.

At a next step 1905, the photovoltaic cell can convert the absorbed optical energy at the second wavelength and generate electrical power. In some instances, the electrical power generated by the photovoltaic cell can be used to power an electrical load that is electrically coupled to the photovoltaic cell. The electrical load can be an electronic device, such as a mobile phone, tablet, or computer. The electrical load can be a vehicle, such as a car, boat, airplane, or train. The electrical load can be a power grid. In some instances, at least some of the electrical power generated by the photovoltaic cell can be used to power the light source, such as when no electrical load is connected to the photovoltaic cell. In some instances, at least some of the electrical power generated by the photovoltaic cell can be used to charge a rechargeable battery (e.g., lithium ion battery), such as when no electrical load is connected to the photovoltaic cell. The rechargeable battery can in turn be used to power the light source. Beneficially, a photon battery assembly used in this method can be at least in part self-sustaining and prevent loss of energy from the system (e.g., other than from inefficient conversion of energy).

Figure 20:
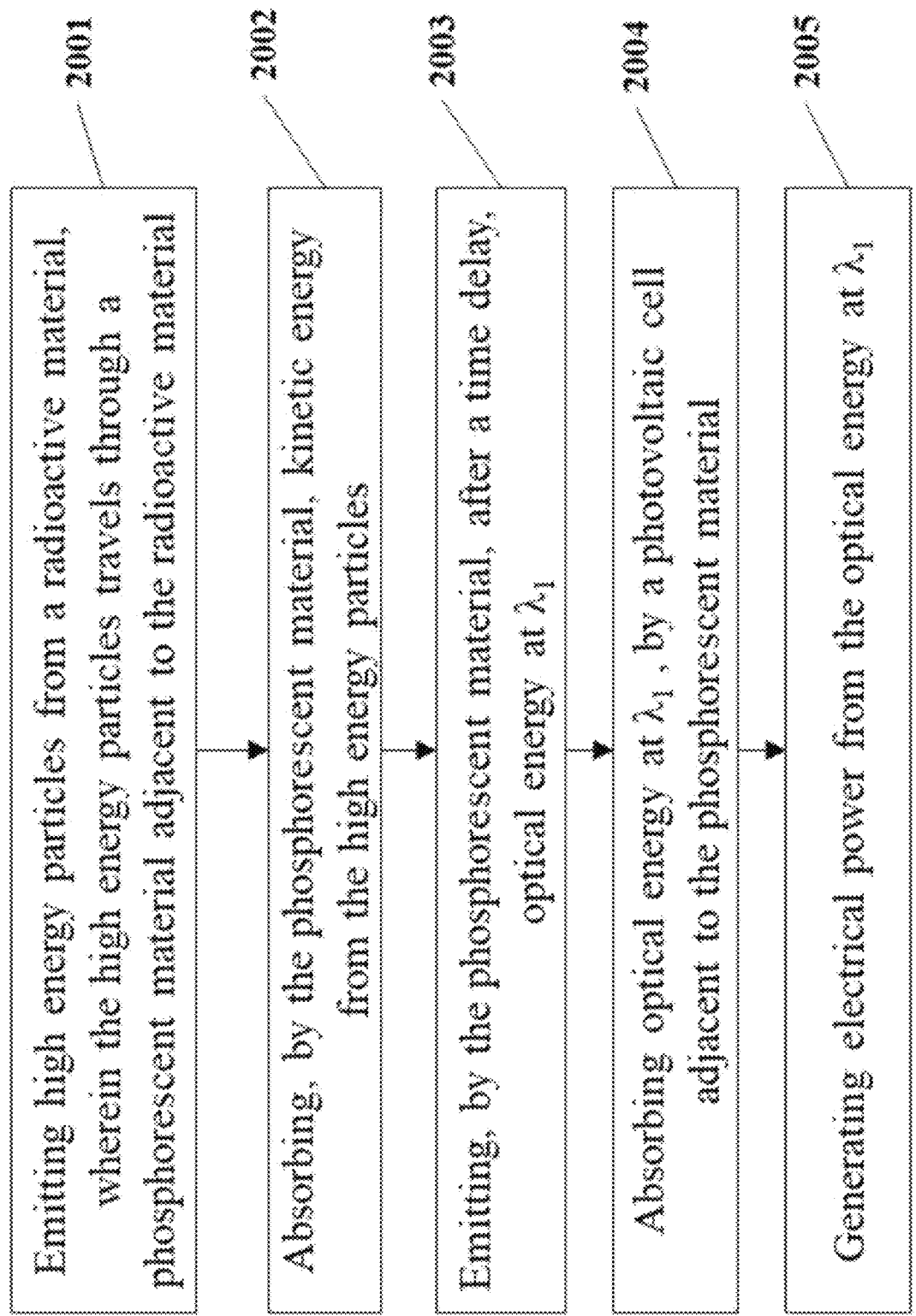
FIG. 20 illustrates a method of storing energy in a photon battery using radioactive material.

FIG. 20 illustrates a method of storing energy in a photon battery using radioactive material. The method can comprise, at a first step 2001, emitting high energy particles from a radioactive material. In some instances, the radioactive material can be adjacent to a phosphorescent material, in which case high energy particles are emitted into or reflected into the phosphorescent material. In some instances, the phosphorescent material can comprise the radioactive material, in which case high energy particles are emitted from within the phosphorescent material. In some instances, the radioactive material can substitute to the light source in some other embodiments discussed herein (e.g., such as in the method of FIG. 19). In some instances, the radioactive material can be in addition to the light source. The radioactive material can emit high energy particles, such as products of radioactive decay. The high energy particles can have high kinetic energy. The high energy particles can travel through the phosphorescent material.

At a next step 2002, the phosphorescent material can absorb the kinetic energy from the high energy particles. For example, the phosphorescent material can be excited by the high energy particles. At a next step 2003, the phosphorescent material can, after a time delay, emit optical energy at a first wavelength (e.g., $\lambda_1$). In some instances, the first wavelength can be a visible wavelength (e.g., 400-700 nm). In some instances, the rate of absorption of the kinetic energy by the phosphorescent material can be faster than the rate of emission of the optical energy by the phosphorescent material.

At a next step 2004, a photovoltaic cell adjacent to the phosphorescent material can absorb the optical energy at the first wavelength that is emitted by the phosphorescent material. For example, a light-absorbing surface of the photovoltaic cell can absorb the optical energy at the first wavelength. In some instances, the photovoltaic cell can be tailored to absorb the wavelength or range of wavelengths that is emitted by the phosphorescent material. In some instances, the light-absorbing surface of the photovoltaic cell can comprise one or more depressions defined by corresponding protrusions to allow for increased interfacial surface area between the phosphorescent material and the photovoltaic cell.

At a next step 2005, the photovoltaic cell can convert the absorbed optical energy at the first wavelength and generate electrical power. In some instances, the electrical power generated by the photovoltaic cell can be used to power an electrical load that is electrically coupled to the photovoltaic cell. The electrical load can be an electronic device, such as a mobile phone, tablet, or computer. The electrical load can be a vehicle, such as a car, boat, airplane, or train. The electrical load can be a power grid. In some instances, at least some of the electrical power generated by the photovoltaic cell can be used to charge a rechargeable battery (e.g., lithium ion battery), such as when no electrical load is connected to the photovoltaic cell. Beneficially, the photon battery assembly used in this method can prevent loss of energy from the system (e.g., other than from inefficient conversion of energy).

Figure 11:
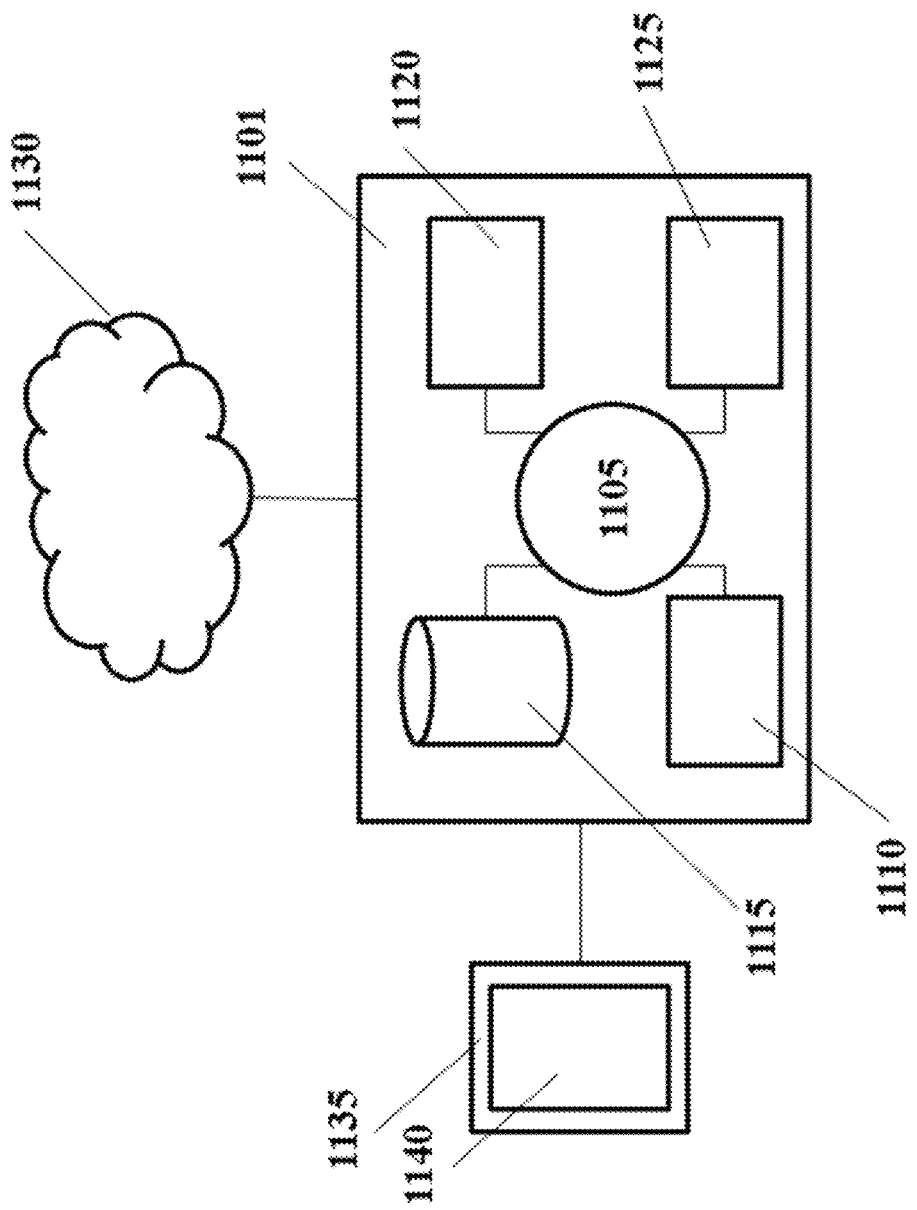
FIG. 11 shows a computer system configured to implement systems and methods of the present disclosure.

FIG. 11 shows a computer control system. The present disclosure provides computer control systems that are programmed to implement methods of the disclosure. A computer system 1101 is programmed or otherwise configured to regulate one or more circuitry in a photon battery assembly, in accordance with some embodiments discussed herein. For example, the computer system 1101 can be a controller, a microcontroller, or a microprocessor. In some cases, the computer system 1101 can be an electronic device of a user or a computer system that is remotely located with respect to the electronic device. The electronic device can be a mobile electronic device. The computer system 1101 can be capable of sensing the connection(s) of one or more electrical loads with a photon battery assembly, the connection(s) of one or more rechargeable batteries with a photon battery assembly, and/or the connection(s) of a photovoltaic cell and a light source within a photon battery assembly. The computer system 1101 may be capable of managing the inflow and/or outflow of power from each or a combination of photon battery assemblies electrically connected in series or in parallel, and in some cases, individually or collectively electrically communicating with a power source and/or an electrical load. The computer system 1101 may be capable of computing a rate of discharge of power from the photon battery and/or a rate of consumption of power by an electrical load. For example, the computer system may be based on such computation, determine whether and how to direct power discharged from a photovoltaic cell to a light source, an external battery (e.g., lithium ion battery), and/or an electrical load. The computer system may be capable of adjusting or regulating a voltage or current of power input and/or power output of the photon battery. The computer system 1101 may be capable of adjusting and/or regulating different component settings. For example, the computer system may be capable of adjusting or regulating a brightness, intensity, color (e.g., wavelength, frequency, etc.), pulsation period, or other optical characteristics of a light emitted by a light source in the photon battery assembly. For example, the computer system may be configured to adjust a light emission setting from a light source depending on the type of phosphorescent material used in the photon battery.

For example, the computer system 1101 can be capable of regulating different charging and/or discharging mechanisms of a photon battery assembly. The computer system may turn on an electrical connection between a light source and a power supply to start charging the photon battery assembly. The computer system may turn off an electrical connection between the light source and the power supply to stop charging the photon battery assembly. The computer system may turn on or off an electrical connection between a photovoltaic cell and an electrical load. In some instances, the computer system may be capable of detecting a charge level (or percentage) of the photon battery assembly. The computer system may be capable of determining when the assembly is completely charged (or nearly completely charged) or discharged (or nearly completely discharged). In some instances, the computer system may be capable of maintaining a certain range of charge level (e.g., 5%~95%, 10%~90%, etc.) of the photon battery assembly, such as to maintain and/or increase the life of the photon battery assembly, which complete charge or complete discharge can detrimentally shorten.

The computer system 1101 includes a central processing unit (CPU, also "processor" and "computer processor" herein) 1105, which can be a single core or multi core processor, or a plurality of processors for parallel processing. The computer system 1101 also includes memory or memory location 1110 (e.g., random-access memory, read-only memory, flash memory), electronic storage unit 1115 (e.g., hard disk), communication interface 1120 (e.g., network adapter) for communicating with one or more other systems, and peripheral devices 1125, such as cache, other memory, data storage and/or electronic display adapters. The memory 1110, storage unit 1115, interface 1120 and peripheral devices 1125 are in communication with the CPU 1105 through a communication bus (solid lines), such as a motherboard. The storage unit 1115 can be a data storage unit (or data repository) for storing data. The computer system 1101 can be operatively coupled to a computer network ("network") 1130 with the aid of the communication interface 1120. The network 1130 can be the Internet, an internet and/or extranet, or an intranet and/or extranet that is in communication with the Internet. The network 1130 in some cases is a telecommunication and/or data network. The network 1130 can include one or more computer servers, which can enable distributed computing, such as cloud computing. The network 1130, in some cases with the aid of the computer system 1101, can implement a peer-to-peer network, which may enable devices coupled to the computer system 1101 to behave as a client or a server.

The CPU 1105 can execute a sequence of machine-readable instructions, which can be embodied in a program or software. The instructions may be stored in a memory location, such as the memory 1110. The instructions can be directed to the CPU 1105, which can subsequently program or otherwise configure the CPU 1105 to implement methods of the present disclosure. Examples of operations performed by the CPU 1105 can include fetch, decode, execute, and writeback.

The CPU 1105 can be part of a circuit, such as an integrated circuit. One or more other components of the system 1101 can be included in the circuit. In some cases, the circuit is an application specific integrated circuit (ASIC).

The storage unit 1115 can store files, such as drivers, libraries and saved programs. The storage unit 1115 can store user data, e.g., user preferences and user programs. The computer system 1101 in some cases can include one or more additional data storage units that are external to the computer system 1101, such as located on a remote server that is in communication with the computer system 1101 through an intranet or the Internet.

The computer system 1101 can communicate with one or more local and/or remote computer systems through the network 1130. For example, the computer system 1101 can communicate with all local energy storage systems in the network 1130. In another example, the computer system 1101 can communicate with all energy storage systems within a single assembly, within a single housing, and/or within a single stack of assemblies. In other examples, the computer system 1101 can communicate with a remote computer system of a user. Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 1101 via the network 1130.

Methods as described herein can be implemented by way of machine (e.g., computer processor) executable code stored on an electronic storage location of the computer system 1101, such as, for example, on the memory 1110 or electronic storage unit 1115. The machine executable or machine readable code can be provided in the form of software. During use, the code can be executed by the processor 1105. In some cases, the code can be retrieved from the storage unit 1115 and stored on the memory 1110 for ready access by the processor 1105. In some situations, the electronic storage unit 1115 can be precluded, and machine-executable instructions are stored on memory 1110.

The code can be pre-compiled and configured for use with a machine having a processor adapted to execute the code, or can be compiled during runtime. The code can be supplied in a programming language that can be selected to enable the code to execute in a pre-compiled or as-compiled fashion.

Aspects of the systems and methods provided herein, such as the computer system 1101, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 1101 can include or be in communication with an electronic display 1135 that comprises a user interface (UI) 1140 for providing, for example, user control options (e.g., start or terminate charging, start or stop powering an electrical load, route power back to self-charging, etc.). Examples of UI's include, without limitation, a graphical user interface (GUI) and web-based user interface.

Methods and systems of the present disclosure can be implemented by way of one or more algorithms. An algorithm can be implemented by way of software upon execution by the central processing unit 1105. The algorithm can, for example, change circuitry of a photon battery assembly or a stack of photon battery assemblies based on, for example, sensing the connection(s) of one or more electrical loads with a photon battery assembly, the connection(s) of one or more rechargeable batteries with a photon battery assembly, and/or the connection(s) of a photovoltaic cell and a light source within a photon battery assembly. The algorithm may be capable of managing the inflow and/or outflow of power from each or a combination of photon battery assemblies electrically connected in series or in parallel, and in some cases, individually or collectively electrically communicating with a power source and/or an electrical load.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A system for storing energy, comprising:
   an assembly, comprising:
   a light source comprising an array of light-emitting diodes configured to emit optical energy at a first wavelength from a surface of the array of light-emitting diodes;
   a phosphorescent material configured to receive light from the array of light-emitting diodes, wherein the phosphorescent material is configured to (i) absorb the optical energy at the first wavelength, and (ii) at a rate slower than a rate of absorption, emit optical energy at a second wavelength, wherein the second wavelength is greater than the first wavelength; and
   a photovoltaic cell adjacent to the phosphorescent material, wherein the photovoltaic cell is configured to (i) absorb optical energy at the second wavelength through a surface of the photovoltaic cell, and (ii) generate electrical power from optical energy; and
   a housing configured to contain the assembly while the assembly is in use.

2. The system of claim 1, wherein the housing containing the assembly is portable.

3. The system of claim 1, wherein the housing is configured to contain the assembly having a maximum dimension of 1 meter.

4. The system of claim 1, wherein the photovoltaic cell is electrically coupled to an electrical load and at least part of the electrical power generated by the photovoltaic cell powers the electrical load.

5. The system of claim 1, wherein a rechargeable battery is electrically coupled to the light source and the photovoltaic cell, and wherein at least part of the electrical power generated by the photovoltaic cell charges the rechargeable battery, and wherein at least part of electrical power discharged by the rechargeable battery powers the light source, wherein the light source is further powered by a power source other than the photovoltaic cell.

6. The system of claim 1, wherein the phosphorescent material comprises strontium aluminate and europium.

7. The system of claim 1, wherein the photovoltaic cell comprises a plurality of depressions between protrusions and wherein the surface of the photovoltaic cell is a surface of a protrusion defining a depression.

8. The system of claim 1, wherein the surface of the array of light-emitting diodes is planar and flat.

9. The system of claim 1, wherein the light source emits directional light that is directed toward the phosphorescent material via a light guide.

10. The system of claim 9, wherein an air gap is provided between the light guide and the phosphorescent material.

11. The system of claim 1, wherein the phosphorescent material is provided in a powder form.

12. The system of claim 1, wherein the photovoltaic cell has a band gap tailored to the second wavelength emitted by the phosphorescent material.

13. The system of claim 1, wherein the assembly comprises a plurality of distinct volumes of the phosphorescent material that receives light from the array of light-emitting diodes, and wherein the photovoltaic cell is adjacent to a volume of the phosphorescent material.

14. The system of claim 1, wherein the assembly is configured to power a plurality of different electrical loads as a battery.

15. A method for storing energy, comprising:
   (a) emitting optical energy at a first wavelength from a surface of a light source;
   (b) absorbing, by a phosphorescent material adjacent to and directly coupled to the surface of the light source, the optical energy at the first wavelength;
   (c) at a rate slower than a rate of absorption, emitting, by the phosphorescent material, optical energy at a second wavelength, wherein the second wavelength is greater than the first wavelength;
   (d) absorbing the optical energy at the second wavelength through a surface of a photovoltaic cell, wherein the surface of the photovoltaic cell is adjacent to the phosphor; and
   (e) generating electrical power from the optical energy at the second wavelength.

16. The method of claim 15, wherein the light source is a light-emitting diode (LED).

17. The method of claim 16, further comprising powering an electrical load electrically coupled to the photovoltaic cell using the electrical power.

18. The method of claim 15, further comprising powering the light source using at least part of the electrical power, wherein the light source is electrically coupled to the photovoltaic cell.

19. The method of claim 15, further comprising (i) charging a rechargeable battery using at least part of the electrical power, wherein the rechargeable battery is electrically coupled to the photovoltaic cell and (ii) powering the light source using at least part of electrical power discharged by the rechargeable battery, wherein the rechargeable battery is electrically coupled to the light source.

20. The method of claim 15, wherein the photovoltaic cell comprises a plurality of depressions between protrusions and wherein the surface of the photovoltaic cell is a surface of a protrusion defining a depression.

* * * * *